(12) United States Patent
Woo et al.

(10) Patent No.: US 10,204,901 B2
(45) Date of Patent: Feb. 12, 2019

(54) SEMICONDUCTOR DEVICES INCLUDING RESISTORS

(71) Applicant: Samsung Electronics Co., Ltd., Suwon-si, Gyeonggi-do (KR)

(72) Inventors: Hyo Seok Woo, Hwaseong-si (KR); Jang Gn Yun, Hwaseong-si (KR); Joon Sung Lim, Yongin-si (KR); Sung Min Hwang, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/723,669

(22) Filed: Oct. 3, 2017

(65) Prior Publication Data

US 2018/0254271 A1  Sep. 6, 2018

(30) Foreign Application Priority Data

Mar. 3, 2017 (KR) .................. 10-2017-0027699

(51) Int. Cl.
| | | |
|---|---|---|
| *H01L 27/00* | (2006.01) | |
| *H01L 27/07* | (2006.01) | |
| *H01L 23/00* | (2006.01) | |
| *H01L 49/02* | (2006.01) | |
| *H01L 29/43* | (2006.01) | |
| *H01L 21/3105* | (2006.01) | |
| *H01L 21/768* | (2006.01) | |
| *H01L 29/49* | (2006.01) | |

(52) U.S. Cl.
CPC .... *H01L 27/0738* (2013.01); *H01L 21/31051* (2013.01); *H01L 21/76895* (2013.01); *H01L 24/06* (2013.01); *H01L 28/24* (2013.01); *H01L 29/435* (2013.01); *H01L 29/4983* (2013.01)

(58) Field of Classification Search
None
See application file for complete search history.

(56) References Cited

U.S. PATENT DOCUMENTS

| | | | |
|---|---|---|---|
| 7,768,006 | B2 | 8/2010 | Zhu et al. |
| 8,067,838 | B2 | 11/2011 | Park |
| 9,082,630 | B2 | 7/2015 | Chuang et al. |
| 9,142,547 | B2 | 9/2015 | Stahrenberg et al. |
| 9,231,045 | B2 | 1/2016 | Hoentschel et al. |
| 9,337,190 | B2 | 5/2016 | Fung |
| 2014/0264610 | A1 | 9/2014 | Yang et al. |
| 2014/0299874 | A1 | 10/2014 | Yamazaki |
| 2015/0004779 | A1 | 1/2015 | Zhu et al. |
| 2015/0187783 | A1 | 7/2015 | Chuang et al. |
| 2015/0311272 | A1 | 10/2015 | Romanescu et al. |
| 2016/0268407 | A1 | 9/2016 | Pillarisetty et al. |

*Primary Examiner* — Reema Patel
(74) *Attorney, Agent, or Firm* — Ward and Smith, P.A.

(57) ABSTRACT

A semiconductor device is provided including a resistor structure on a semiconductor substrate. The resistor structure includes pad portions and a resistor body connecting the pad portions. The pad portions each have a width greater than a width of the resistor body. The pad portions each include a pad pattern and a liner pattern covering a sidewall and a lower surface of the pad pattern. The resistor body extends laterally from the liner pattern. The pad pattern includes a different material from the resistor body and the liner pattern.

20 Claims, 27 Drawing Sheets

SEMICONDUCTOR DEVICES INCLUDING RESISTORS

CROSS-REFERENCE TO RELATED APPLICATION

This application claims priority under 35 U.S.C. § 119 to Korean Patent Application No. 10-2017-0027699, filed on Mar. 3, 2017 in the Korean Intellectual Property Office, the disclosure of which is hereby incorporated herein by reference in its entirety.

FIELD

Embodiments of the present inventive concept generally relate to semiconductor devices and, more particularly, to semiconductor devices including resistors.

BACKGROUND

Semiconductor devices generally include a transistor, a diode, a capacitor, a resistor or the like. In semiconductor devices including resistors, the resistor is generally formed of a low resistivity metal used to form a gate electrode or an interconnection line, thus, an increasing length of the resistor is needed to meet a desired magnitude of resistance of the resistor. The increasing length of the resistor results in a larger resistor occupying a larger area in the semiconductor device, which, as semiconductor devices become increasingly smaller, presents a problem.

SUMMARY

Some embodiments of the present inventive concept provide a semiconductor device including a semiconductor substrate and a resistor structure on a semiconductor substrate. The resistor structure includes pad portions and a resistor body connecting the pad portions. The pad portions each have a width greater than a width of the resistor body. The pad portions each include a pad pattern and a liner pattern covering a sidewall and a lower surface of the pad pattern. The resistor body extends laterally from the liner pattern. The pad pattern includes a different material from the resistor body and the liner pattern.

Further embodiments of the present inventive concept provide a semiconductor device including a semiconductor substrate, a first resistor structure on the semiconductor substrate and a first transistor on the semiconductor substrate. The first transistor includes a first gate structure including a first gate electrode structure and a first gate dielectric layer covering a sidewall and a lower surface of the first gate electrode structure. The first gate electrode structure includes a first gate electrode pattern and a second gate electrode pattern. The first gate electrode pattern covers a sidewall and a lower surface of the second gate electrode pattern and includes a conductive material having a higher resistivity than the second gate electrode pattern. The first resistor structure includes a first pad portions and a first resistor body connecting the first pad portions. The first resistor structure includes a same material as the first gate electrode pattern.

DETAILED DESCRIPTION OF THE EMBODIMENTS

Various example embodiments will be described more fully with reference to the accompanying drawings, in which some example embodiments are shown. The present inventive concept may, however, be embodied in many different forms and should not be construed as limited to the embodiments set forth herein.

Figure 1:
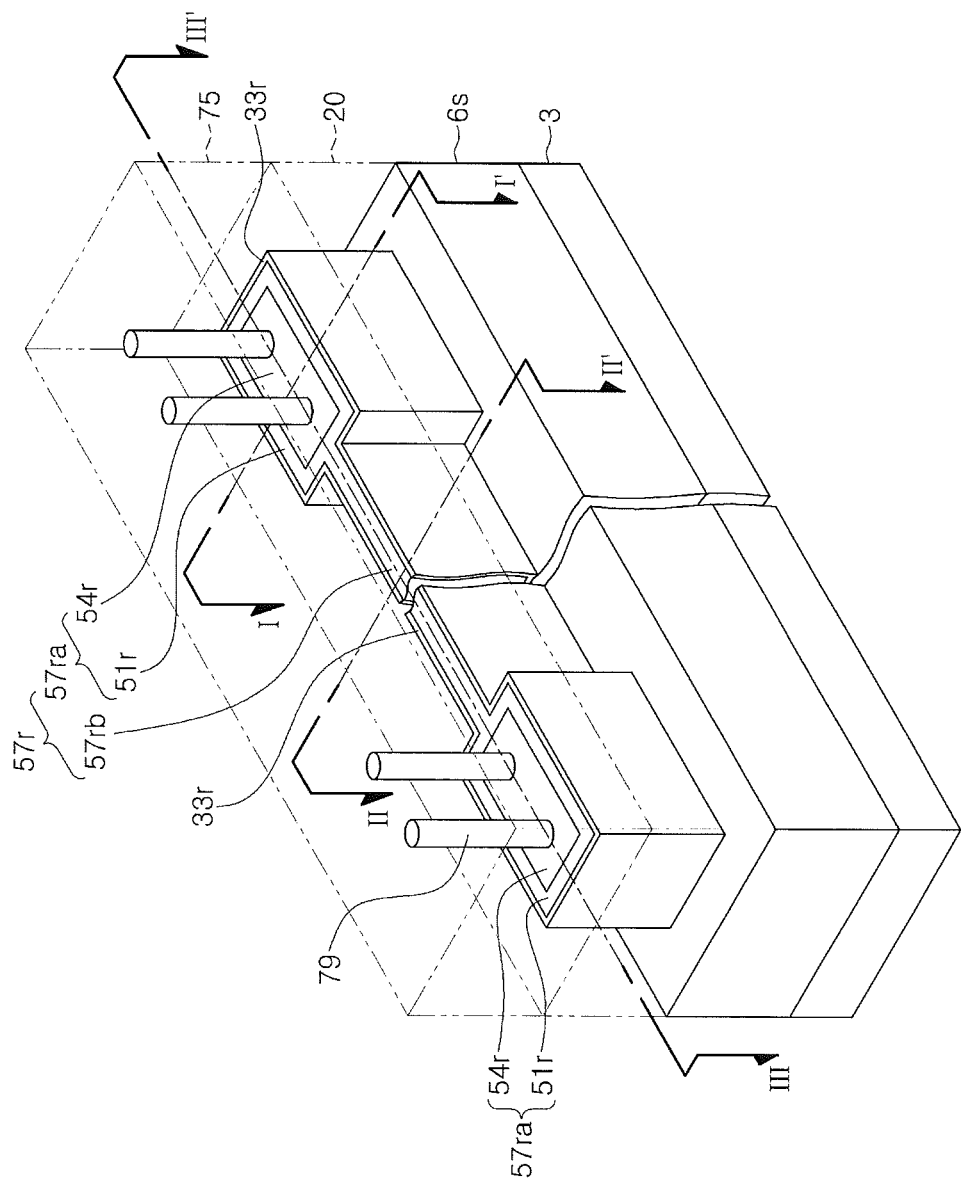
FIG. 1 is a perspective view illustrating a semiconductor device according to some embodiments of the present inventive concept.
Figure 2A:
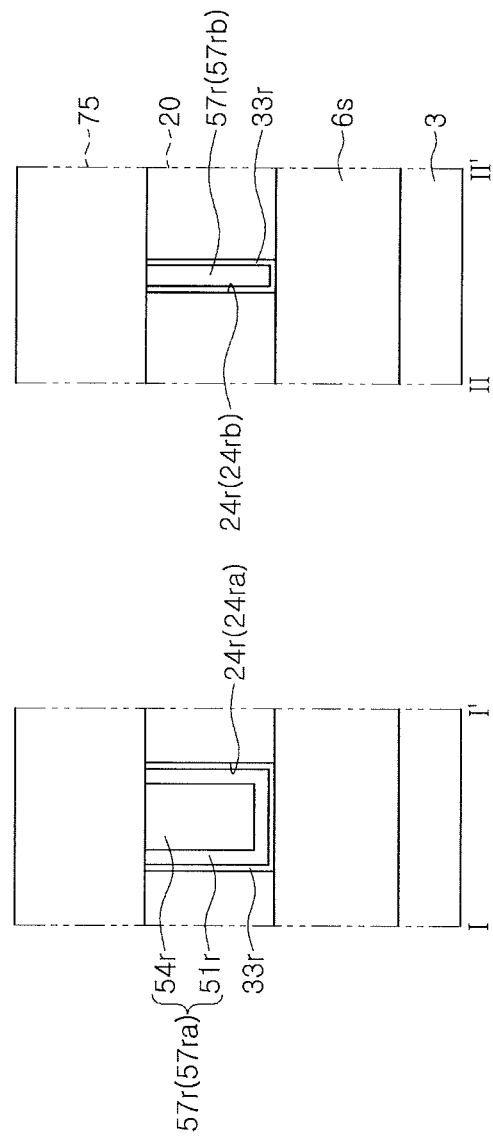
FIGS. 2A and 2B are cross-sections illustrating a semiconductor device according to some embodiments of the present inventive concept.
Figure 2B:
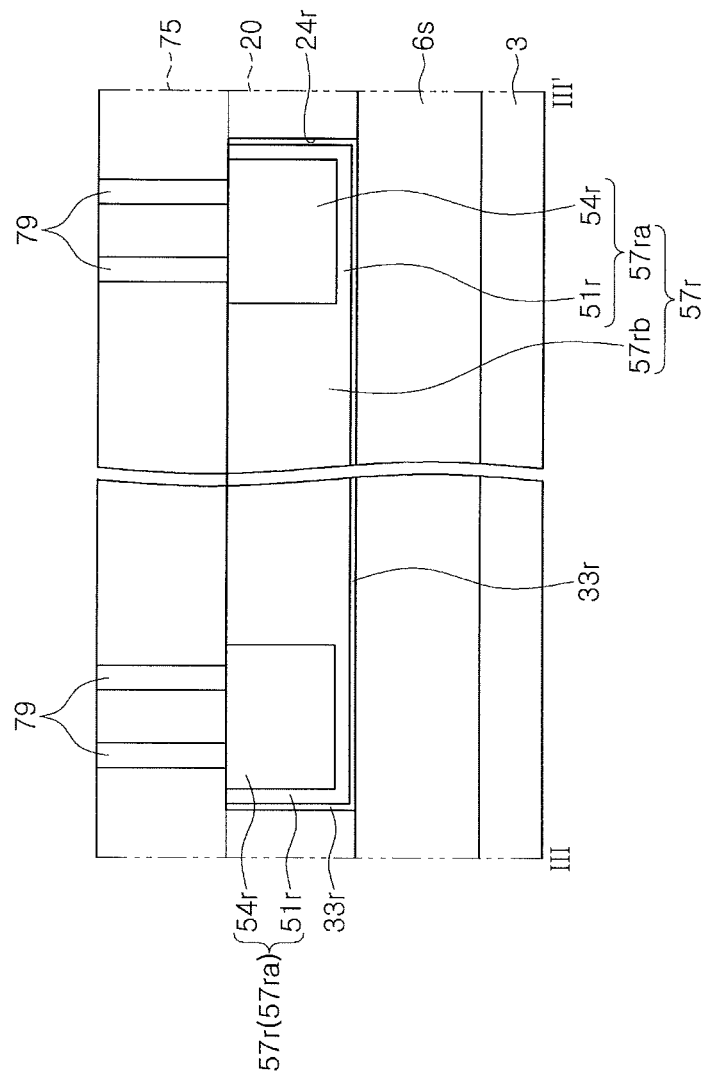

FIG. 1 is a perspective view illustrating a semiconductor device according to some embodiments of the present inventive concept. FIG. 2A illustrates a semiconductor device according to some embodiments and is a cross-section taken along lines I-I' and II-II' of FIG. 1. FIG. 2B illustrates a semiconductor device according to some embodiments and is a cross-section taken along line III-III' of FIG. 1.

Referring to FIGS. 1, 2A and 2B, a resistor structure 57r may be disposed on a semiconductor substrate 3. In some embodiments, the resistor structure 57r may be disposed on an isolation region 6s on the semiconductor substrate 3. The semiconductor substrate 3 may include, for example, a semiconductor material, such as silicon. The isolation region 6s may be formed on the semiconductor substrate 3 and may be formed of an insulating material such as silicon oxide.

A resistor dielectric layer 33r may be formed to cover a sidewall and a lower surface of the resistor structure 57r. The resistor dielectric layer 33r may be formed of a high-k dielectric material, for example, hafnium oxide or aluminum oxide, having a higher dielectric constant than silicon oxide.

A lower insulating structure 20 including a resistor opening 24r may be formed on the isolation region 6s. The resistor opening 24r of the lower insulating structure 20 may include pad openings 24ra and a body opening 24rb between the pad openings 24ra. The pad openings 24ra may each have a width greater than a width of the body opening 24rb. The lower insulating structure 20 may be formed of silicon oxide, a low-k dielectric material and/or silicon nitride. In some embodiments, the resistor structure 57r and the lower insulating structure 20 may fill the resistor opening 24r of the lower insulating structure 20.

The resistor structure 57r may include pad portions 57ra and a resistor body 57rb connecting the pad portions 57ra. In some embodiments, the pad portions 57ra may each have a width greater than a width of the resistor body 57rb. The pad portions 57ra may each include a pad pattern 54r and a liner pattern 51r surrounding a sidewall and a lower surface of the pad pattern 54r. The pad pattern 54r may be formed to have a pillar shape. The liner pattern 51r may cover the sidewall and the lower surface of the pad pattern 54r to contact the pad pattern 54r. The resistor body 57rb of the resistor structure 57r may be formed to continuously and laterally extend from the liner pattern 51r. The resistor body 57rb may be integrally coupled to the liner pattern 51r.

The pad portions 57ra of the resistor structure 57r may fill the pad openings 24ra of the lower insulating structure 20. The resistor body 57rb of the resistor structure 57r may fill the body opening 24rb of the lower insulating structure 20.

In some embodiments, the pad pattern 54r and the liner pattern 51r of each of the pad portions 57ra may be formed of different conductive materials. The liner pattern 51r may be formed of a conductive material having a resistivity different from that of the pad pattern 54r. For example, the pad pattern 54r may be formed of a low-resistance conductive material, such as tungsten, having a resistivity lower than that of the liner pattern 51r. The liner pattern 51r may be formed of a high-resistance conductive material, for example, metal alloy, such as titanium-nitride (TiN), tantalum-nitride (TaN), titanium-aluminum (TiAl) or titanium-aluminum-carbon (TiAlC), having a resistivity higher than that of the pad pattern 54r. However, the present inventive concept is not limited thereto. For example, the pad pattern 54r may include tungsten, and the liner pattern 51r may include multiple layers, of which at least one is formed of polysilicon having a resistivity higher than that of the pad pattern 54r.

An upper insulating structure 75 may be formed on the lower insulating structure 20 to cover the resistor structure 57r. Resistor contact plugs 79 may be formed to penetrate the upper insulating structure 75 and to be electrically connected to the pad portions 57ra of the resistor structure 57r.

In the example embodiments of FIGS. 1, 2A and 2B, at least one of the elements constituting a semiconductor device may be modified. Hereinafter, the element to be modified will be described. It will be understood that other elements not to be modified are the same as described above even without separate descriptions.

Figure 3A:
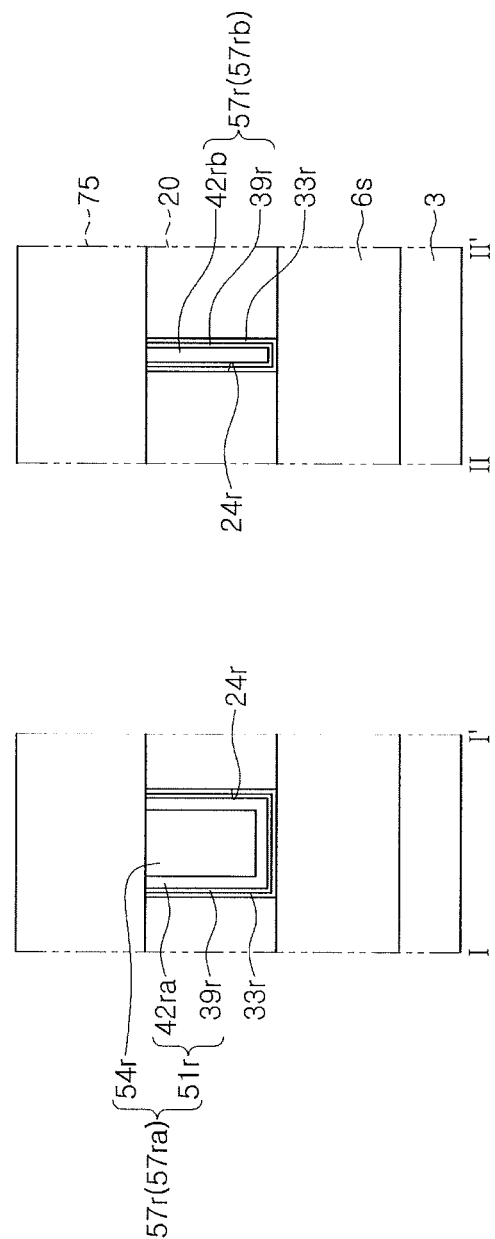
FIGS. 3A and 3B are cross-sections illustrating a semiconductor device according to some embodiments of the present inventive concept.
Figure 3B:
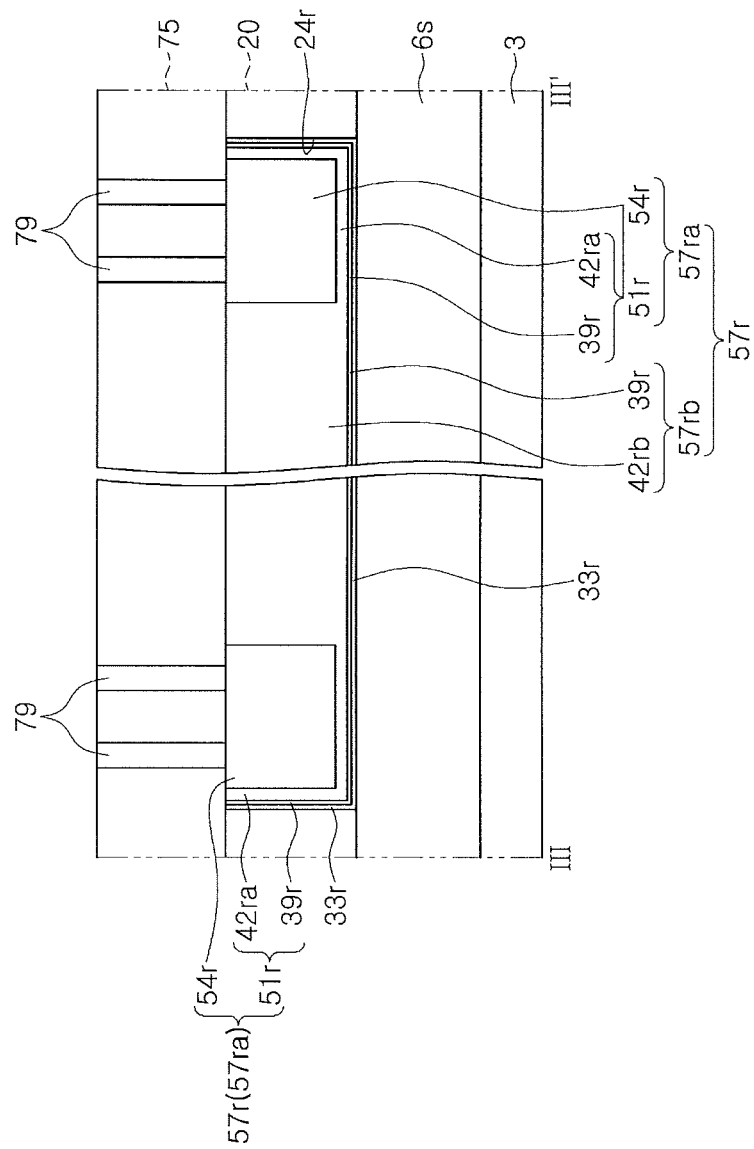

FIGS. 3A and 3B illustrate a resistor structure of a semiconductor device according to some embodiments of the present inventive concept. FIG. 3A is a cross-section taken along lines I-I' and II-II' of FIG. 1. FIG. 3B is a cross-section taken along line III-III' of FIG. 1.

Referring to FIGS. 1, 3A and 3B, as described in FIGS. 1, 2A and 2B, the resistor structure 57r may include the resistor body 57rb and the pad portions 57ra each including the liner pattern 51r and the pad pattern 54r.

The liner pattern 51r and the resistor body 57rb may include at least two conductive layers. For example, the liner pattern 51r and the resistor body 57rb may commonly include a first conductive layer 39r. The liner pattern 51r may include a second conductive layer 42ra and the resistor body 57rb may include a second conductive layer 42rb. The second conductive layer 42ra of the liner pattern 51r may be located closer to the pad pattern 54r than the first conductive layer 39r and may cover the sidewall and the lower surface of the pad pattern 54r. The second conductive layer 42rb of the resistor body 57rb may continuously and laterally extend from the second conductive layer 42ra of the liner pattern 51r and may have a pillar shape. The second conductive layer 42rb of the resistor body 57rb may be integrally coupled to the second conductive layer 42ra of the liner pattern 51r. The first conductive layer 39r may be closer to the resistor dielectric layer 33r than the second conductive layer 42ra and 42rb. The first conductive layer 39r may contact the resistor dielectric layer 33r. The second conductive layer 42ra of the liner pattern 51r may contact the sidewall and the lower surface of the pad pattern 54r.

In some embodiments, the liner pattern 51r may be formed of metal alloy, for example, TiAl, TiAlC, TiN and/or TaN. For example, the first conductive layer 39r of the liner pattern 51r may include one of TiAl, TiAlC, TiN and TaN, and the second conductive layer 42ra of the liner pattern 51r may include another one of TiAl, TiAlC, TiN and TaN.

Figure 4:
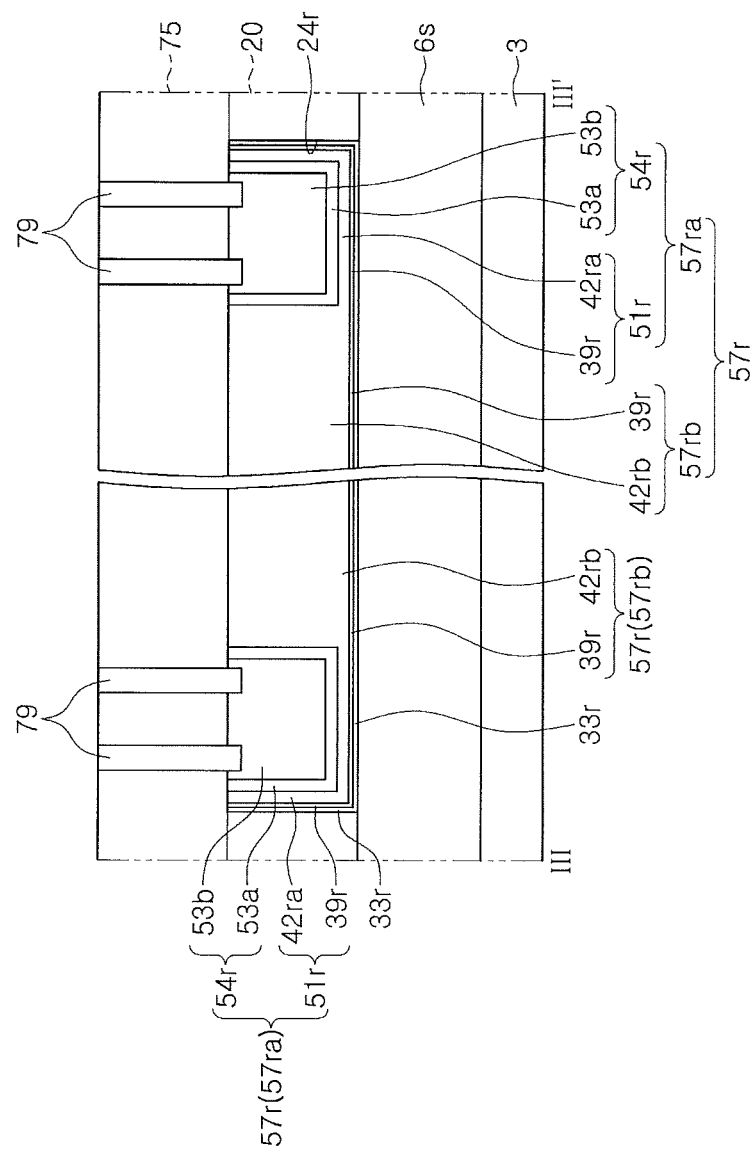
FIG. 4 is a cross-section illustrating a semiconductor device according to some embodiments of the present inventive concept.

FIG. 4 illustrates a resistor structure of a semiconductor device according to some embodiments and is a cross-section taken along line III-III' of FIG. 1. Referring to FIGS. 1 and 4, in the pad pattern 54r of the resistor structure 57r as described in FIGS. 1, 2A and 2B, the pad pattern 54r may include a first pad layer 53a and a second pad layer 53b. The second pad layer 53b may have a pillar shape. The first pad layer 53a may cover a sidewall and a lower surface of the second pad layer 53b. In some embodiments, the first pad layer 53a may function as a seed layer for forming the second pad layer 53b. However, the present inventive concept is not limited thereto. For example, the first pad layer 53a and the second pad layer 53b may be formed of different materials.

Figure 5:
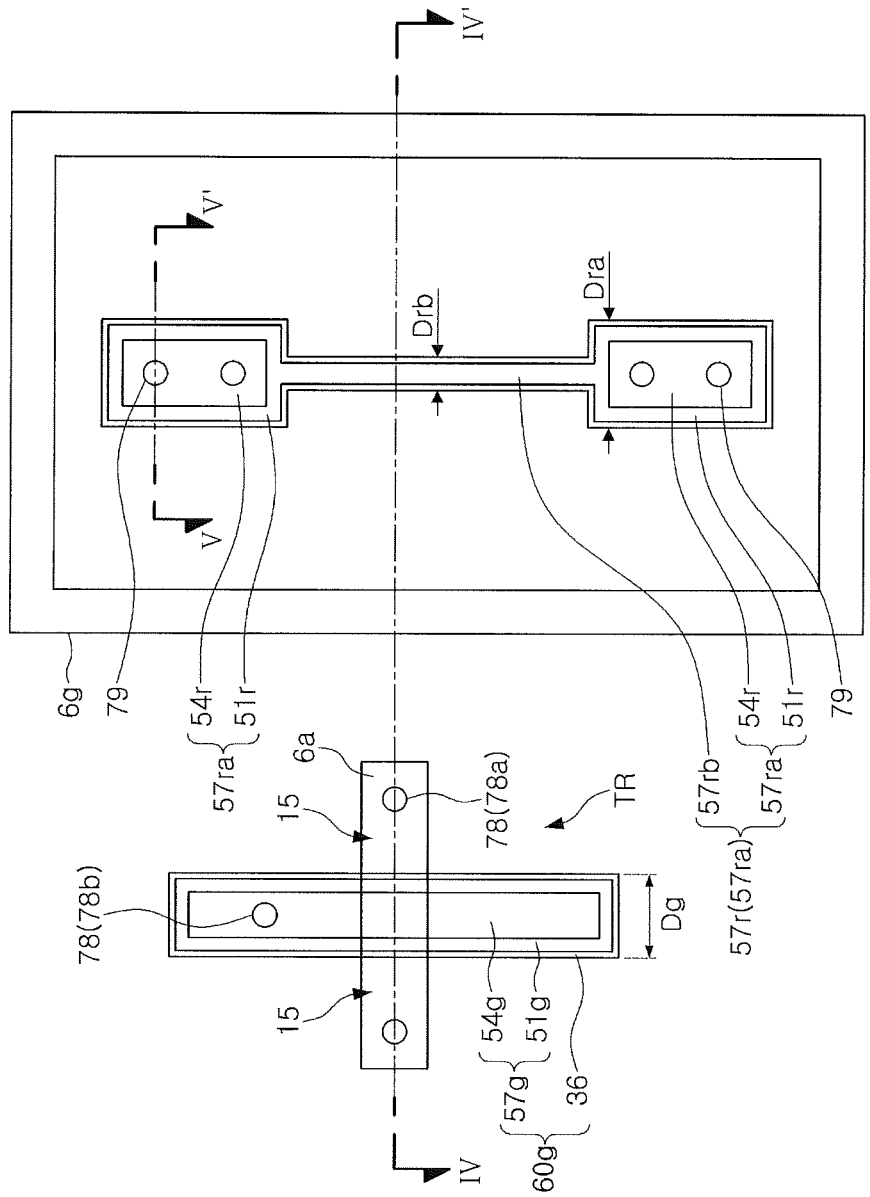
FIG. 5 is a plan view illustrating a semiconductor device according to some embodiments of the present inventive concept.
Figure 6:
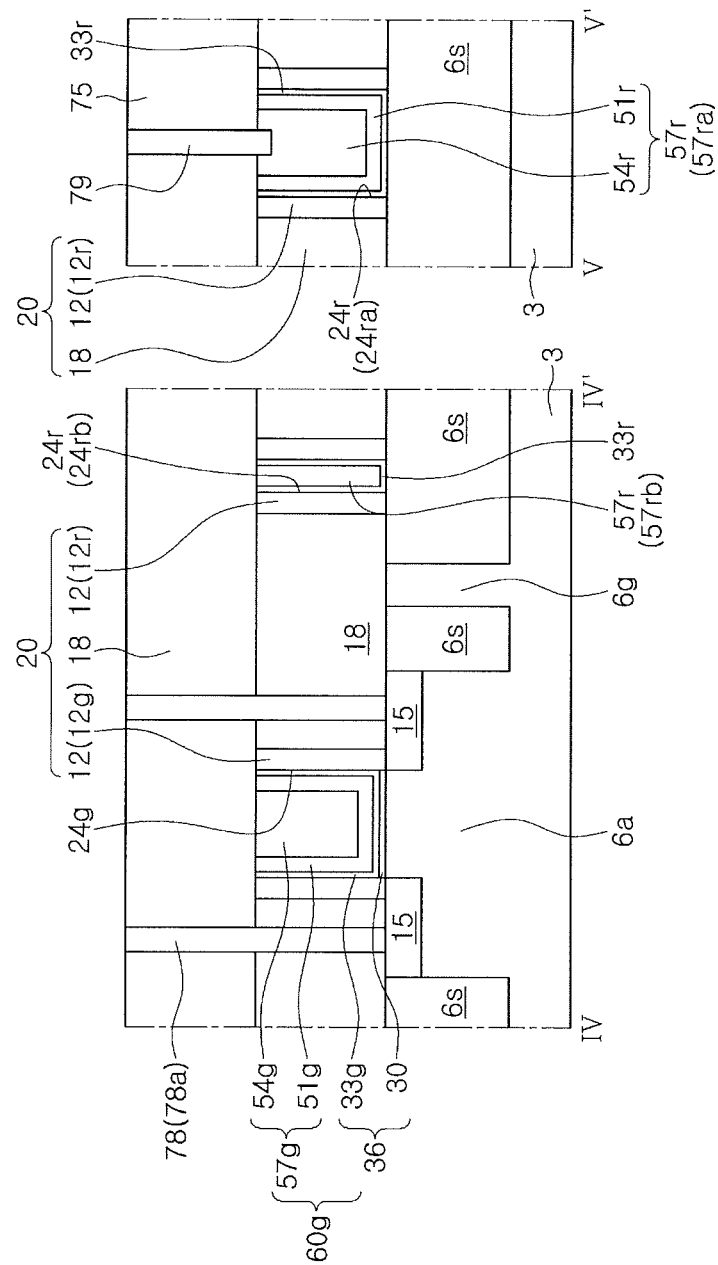
FIGS. 6 to 9 are cross-sections, respectively, illustrating a semiconductor device according to some embodiments of the present inventive concept.

A semiconductor device according to some embodiments may include a transistor including the same material as at least one of the materials forming the resistor structure 57r. FIG. 5 is a plan view illustrating a semiconductor device including a transistor according to some embodiments. FIG. 6 is a cross-section taken along lines IV-IV' and V-V' of FIG. 6.

Referring to FIGS. 5 and 6, an isolation region 6s may be formed on a semiconductor substrate 3 to define an active region 6a and a guard ring 6g. The isolation region 6s may be formed of an insulating material such as silicon oxide.

A transistor TR may be formed on the semiconductor substrate 3. The transistor TR may include a gate structure 60g crossing the active region 6a and source/drain regions 15 in the active region 6a at opposite sides of the gate structure 60g.

The gate structure 60g may include a gate electrode structure 57g and a gate dielectric structure 36 covering a sidewall and a lower surface of the gate electrode structure 57g.

The gate dielectric structure 36 may include a gate dielectric layer 33g covering the sidewall and the lower surface of the gate electrode structure 57g and an interfacial dielectric layer 30 between the gate dielectric layer 33g and the active region 6a. The interfacial dielectric layer 30 may be formed of silicon oxide. The interfacial dielectric layer 30 may be referred to as an interfacial oxide.

The gate electrode structure 57g may intersect the active region 6a. The gate electrode structure 57g may include a first gate electrode pattern 51g and a second gate electrode pattern 54g. The second gate electrode pattern 54g may have a pillar shape. The first gate electrode pattern 51g may cover a sidewall and a lower surface of the second gate electrode pattern 54g.

The first gate electrode pattern 51g may include a work function adjusting layer. In some embodiments, the first gate electrode pattern 51g may include TiAl, TiAlC or a combination thereof. In other embodiments, the first gate electrode pattern 51g may include TiN or TaN.

The resistor structure 57r and the resistor dielectric layer 33r covering the sidewall and the lower surface of the resistor structure 57r described in FIGS. 1, 2A and 2B may be formed on the isolation region 6s surrounded by the guard ring 6g. The resistor structure 57r may be the resistor structure as described in FIGS. 3A and 3B or in FIG. 4.

The resistor structure 57r may include the pad portions 57ra and the resistor body 57rb as described in FIGS. 1, 2A and 2B. The pad portions 57ra of the resistor structure 57r may each include the liner pattern 51r and the pad pattern 54r. The resistor body 57rb may be formed to continuously and laterally extend from the liner pattern 51r. The resistor body 57rb may be integrally coupled to the liner pattern 51r. Thus, the resistor body 57rb and the liner pattern 51r may be formed of the same material.

The liner pattern 51r and the resistor body 57rb may be formed of the same material as the first gate electrode pattern 51g. The pad pattern 54r may be formed of the same material as the second gate electrode pattern 54g. The pad pattern 54r and the second gate electrode pattern 54g may be formed of a conductive material having a lower resistivity than that of each of the liner pattern 51r, the resistor body 57rb and the first gate electrode pattern 51g. For example, the liner pattern 51r, the resistor body 57rb and the first gate electrode pattern 51g may be formed of, for example, TiAl, TiAlC, TiN, TaN or a combination thereof. The pad pattern 54r and the second gate electrode pattern 54g may be formed of, for example, metal such as tungsten.

A lower insulating structure 20 may be formed on the semiconductor substrate 3. The lower insulating structure 20 may include a gate opening 24g and a resistor opening 24r.

The gate structure 60g may fill the gate opening 24g. The resistor structure 57r and the resistor dielectric layer 33r may fill the resistor opening 24r.

In some embodiments, the resistor opening 24r may include pad openings 24ra and a body opening 24rb. The pad openings 24ra may each have a width greater than a width of the body opening 24rb. The pad portions 57ra of the resistor structure 57r may be formed in the pad openings 24ra. The resistor body 57rb of the resistor structure 57r may be formed in the body opening 24rb.

In some embodiments, the width of the body opening 24rb may have smaller than a width of the gate opening 24g. The body opening 24rb may be filled with the conductive material forming the liner pattern 51r but may not be filled with the conductive material forming the pad pattern 54r. Thus, in the resistor structure 57r, the resistor body 57rb may not include the conductive material forming the pad pattern 54r. For example, when the pad pattern 54r is formed of tungsten having a relatively low resistivity, the resistor body 57rb may not include tungsten and may include the conductive material forming the liner pattern 51r, for example, TiN, TaN, TiAl, and/or TiAlC, having a higher resistivity than that of tungsten.

The lower insulating structure 20 may include a lower insulating layer 18 and spacers 12. The spacers 12 may include a gate spacer 12g covering a sidewall of the gate structure 60g and a resistor spacer 12r covering the sidewall of the resistor structure 57r. The lower insulating layer 18 may be formed of silicon oxide and/or a low-k dielectric material. The spacers 12 may be formed of silicon nitride and/or silicon oxynitride.

The resistor dielectric layer 33r covering the sidewall and the lower surface of the resistor structure 57r may be formed of the same material as the gate dielectric layer 33g. For example, the resistor dielectric layer 33r and the gate dielectric layer 33g may be formed of a high-k dielectric material having a greater dielectric constant than that of the lower insulating structure 20. The resistor dielectric layer 33r and the gate dielectric layer 33g may be formed of, for example, hafnium-based dielectric, for example, HfO or HfSiO, aluminum-based dielectric, for example, AlO, lanthanum-based dielectric, for example, LaO, or a combination thereof.

An upper insulating structure 75 may be formed on the lower insulating structure 20 to cover the resistor structure 57r and the gate structure 60g. The upper insulating structure 75 may be formed of silicon oxide.

Transistor contact plugs 78 and resistor contact plugs 79 may be formed on the semiconductor substrate 3. The resistor contact plugs 79 may penetrate the upper insulating structure 75 to be electrically connected to the pad portions 57ra of the resistor structure 57r. The transistor contact plugs 78 may be electrically connected to the transistor TR. The transistor contact plugs 78 may include a source/drain contact plug 78a penetrating the upper insulating structure 75 and the lower insulating structure 20 to be electrically connected to the source/drain regions 15 of the transistor TR and a gate contact plug 78b penetrating the upper insulating structure 75 to be electrically connected to the gate electrode structure 57g of the transistor TR.

In some embodiments, the gate electrode structure 57g and the resistor structure 57r filling the gate opening 24g and resistor opening 24r, respectively, of the lower insulating structure 20 may each have an upper surface substantially coplanar with an upper surface of the lower insulating structure 20. However, the present inventive concept is not limited thereto. For example, the upper surface of each of the gate electrode structure 57g and the resistor structure 57r may be lower than the upper surface of the lower insulating structure 20 relative to an upper surface of the semiconductor substrate 3.

Figure 7:
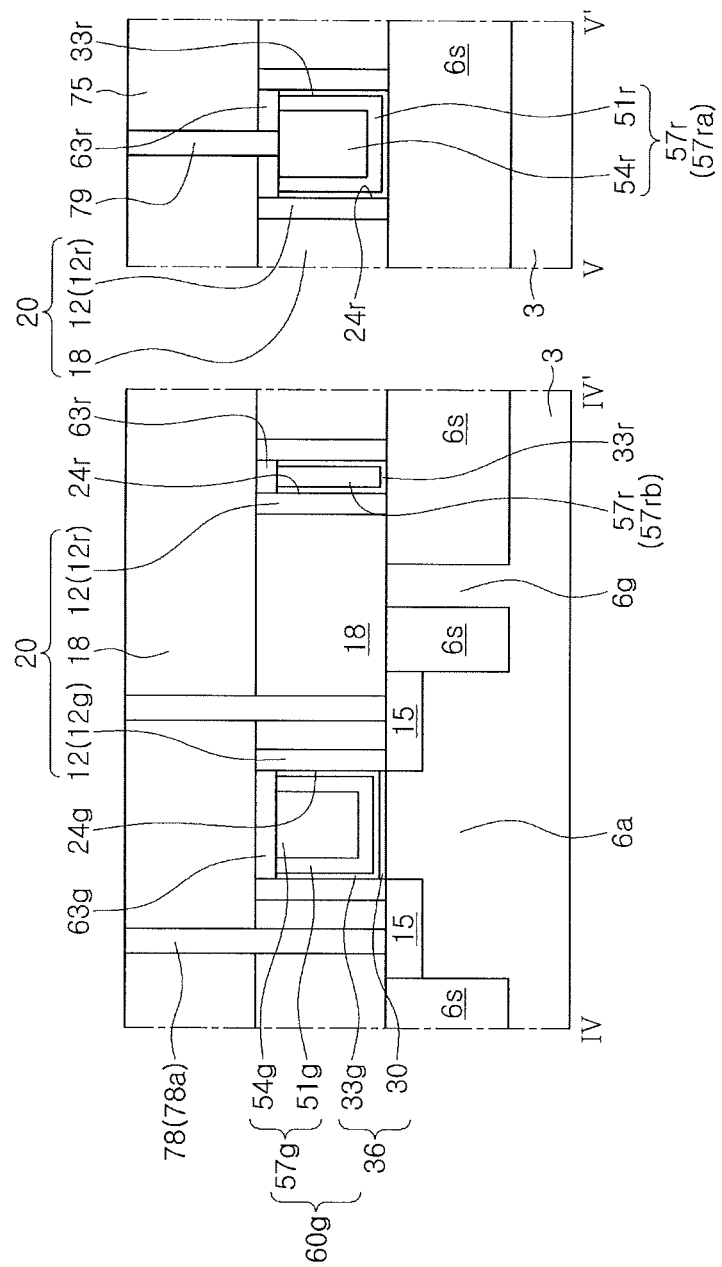

The gate electrode structure 57g and the resistor structure 57r may be modified. FIG. 7 illustrates a gate electrode structure and a resistor structure of a semiconductor device according to example embodiments and is a cross-section taken along lines IV-IV' and V-V' of FIG. 5.

Referring to FIGS. 5 and 7, a gate electrode structure 57g may partially fill the gate opening 24g of the lower insulating structure 20, and a resistor structure 57r may partially fill the resistor opening 24r of the lower insulating structure 20. A gate capping pattern 63g may be formed on the gate electrode structure 57g to fill a remaining portion of the gate opening 24g. A resistor capping pattern 63r may be formed on the resistor structure 57r to fill a remaining portion of the resistor opening 24r. The gate capping pattern 63g and the resistor capping pattern 63r may be formed of the same material, for example, silicon nitride.

Figure 8:
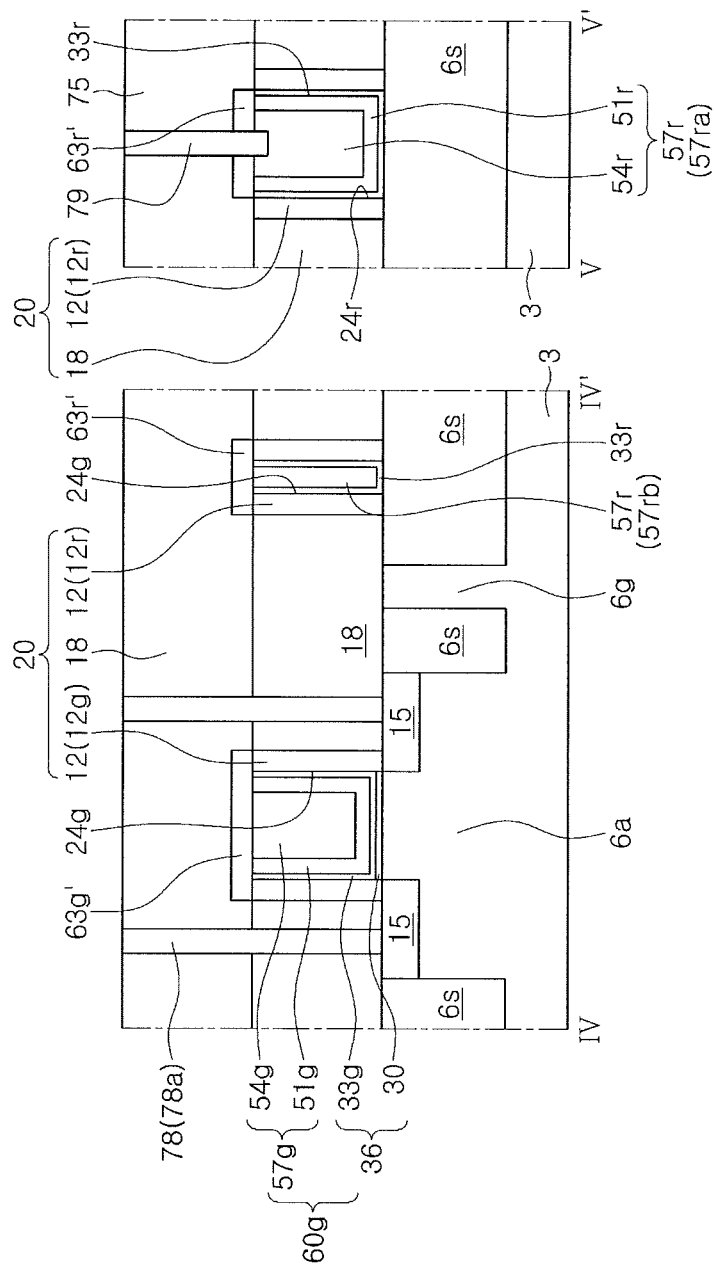

The gate capping pattern 63g and the resistor capping pattern 63r may be modified. FIG. 8 illustrates a gate capping pattern and a resistor capping pattern of a semiconductor device according to example embodiments and is a cross-section taken along lines IV-IV' and V-V' of FIG. 5.

Referring to FIGS. 5 and 8, a gate capping pattern 63g' and a resistor capping pattern 63r' may be formed on the semiconductor substrate 3. The gate capping pattern 63g' may cover an upper surface of the gate electrode structure 57g in the gate opening 24g of the lower insulating structure 20 as described in FIG. 6. The resistor capping pattern 63r' may cover an upper surface of the resistor structure 57r in the resistor opening 24r of the lower insulating structure 20 as described in FIG. 6.

Referring again to FIGS. 5 and 6, in some embodiments, the first gate electrode pattern 51g and the liner pattern 51r may each be formed of a single layer, but are not limited thereto. For example, the first gate electrode pattern 51g and the liner pattern 51r may each be formed of multiple layers. For example, the liner pattern 51r may include the first conductive layer 39r and the second conductive layer 42ra as described in FIGS. 3A and 3B. The first gate electrode pattern 51g may have substantially the same structure as the liner pattern 51r including the first and second conductive layers 39r and 42ra as described in FIGS. 3A and 3B.

Figure 9:
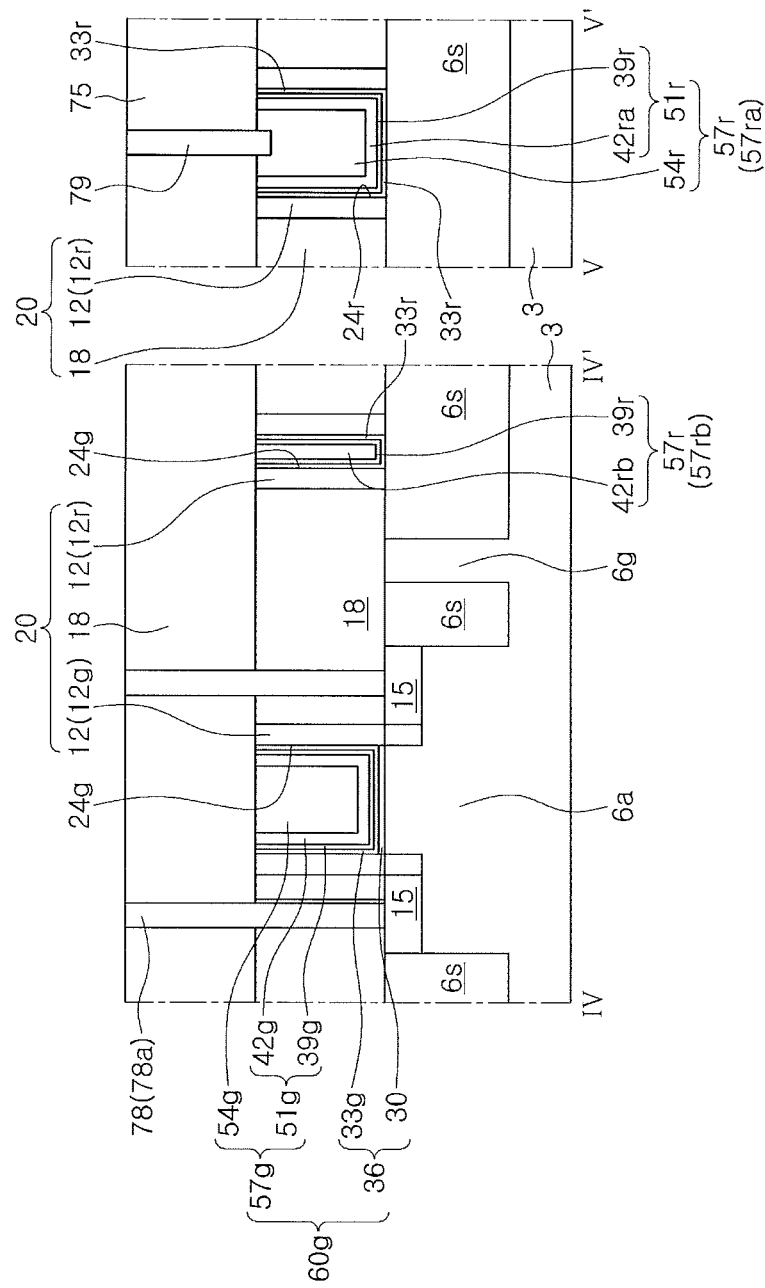

FIG. 9 illustrates a semiconductor device including a gate electrode pattern having the same structure as a liner pattern including first and second conductive layers according to example embodiments and is a cross-section taken along lines IV-IV' and V-V' of FIG. 5.

Referring to FIGS. 5 and 9, a first gate electrode pattern 51g may include a first conductive layer 39g corresponding to the first conductive layer 39r of the liner pattern 51r as described in FIGS. 3A and 3B and a second conductive layer 42g corresponding to the second conductive layer 42ra of the liner pattern 51r as described in FIGS. 3A and 3B. Thus, the first gate electrode pattern 51g may include the first conductive layer 39g and the second conductive layer 42g on the first conductive layer 39g.

In some embodiments, a width Drb of the resistor body 57rb of the resistor structure 57r may be smaller than a width Dg of the gate electrode structure 57g, but the present inventive concept is not limited thereto. For example, the width Drb of the resistor body 57rb of the resistor structure 57r may be substantially equal to the width Dg of the gate electrode structure 57g. In some embodiments, the resistor body 57rb of the resistor structure 57r may be formed of the same material as the first gate electrode pattern 51g of the gate electrode structure 57g. However, the present inventive concept is not limited thereto. For example, at least a portion of the resistor body 57rb of the resistor structure 57r may include a material different from that of the first gate electrode pattern 51g of the gate electrode structure 57g.

Figure 10:
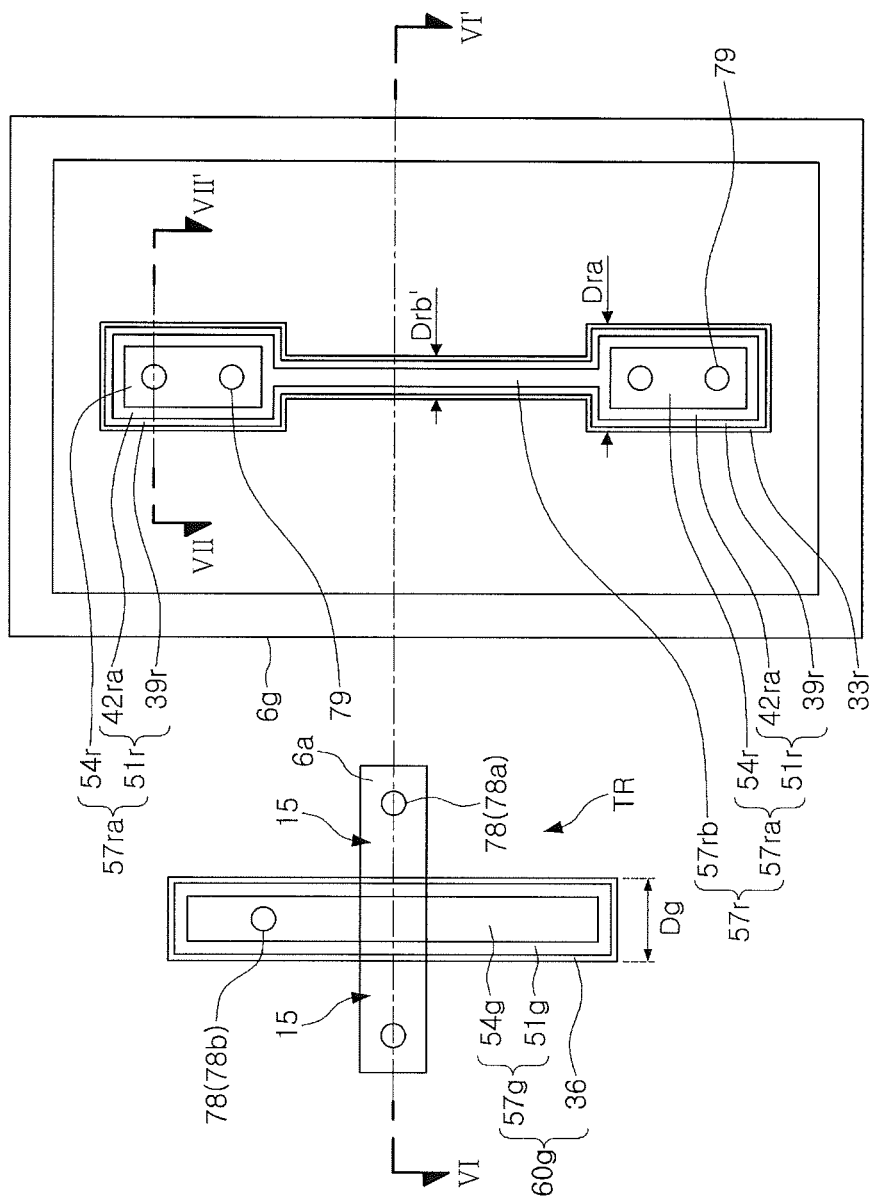
FIG. 10 is a plan view illustrating a semiconductor device according to some embodiments of the present inventive concept.
Figure 11:
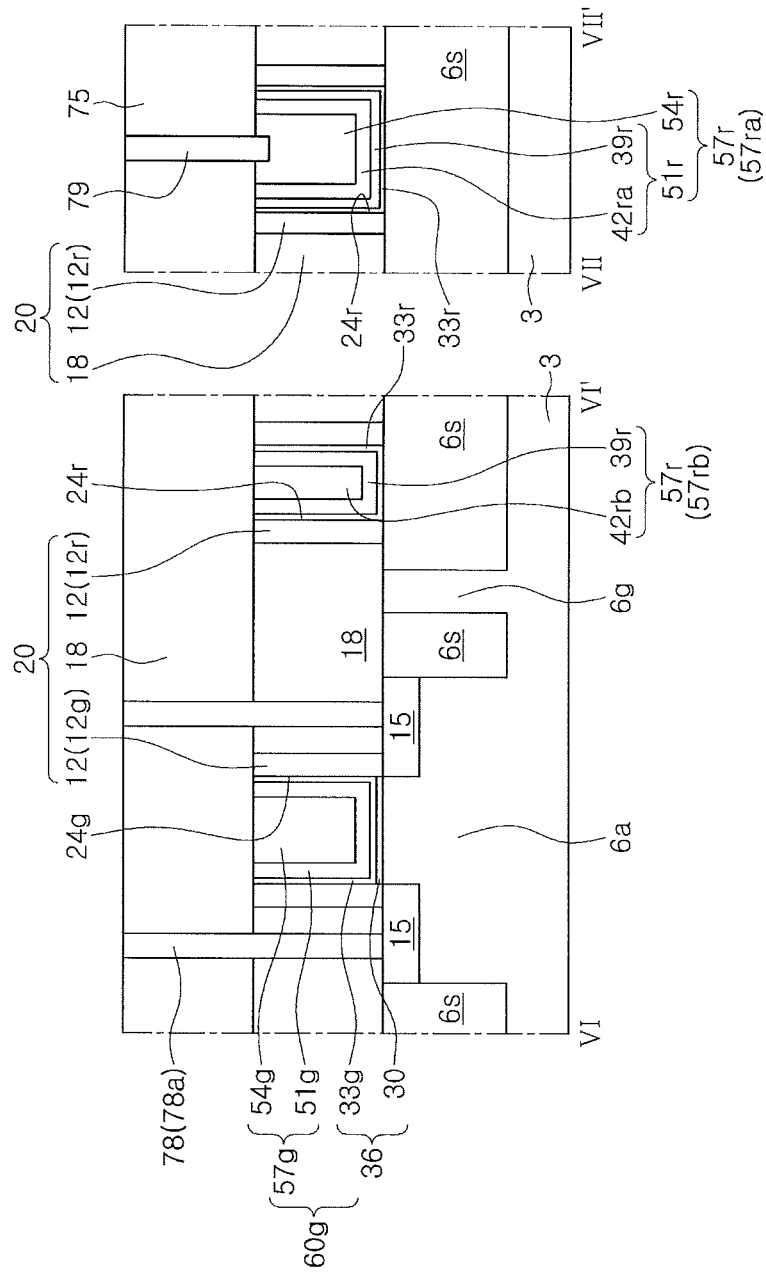
FIG. 11 is a cross-section illustrating a semiconductor device according to some embodiments of the present inventive concept.

FIG. 10 a plan view illustrating a semiconductor device according to some embodiments and is a plan view. FIG. 11 is a cross-section taken along lines VI-VI' and VII-VII' of FIG. 10.

Referring to FIGS. 10 and 11, a transistor TR having the same structure as described in FIGS. 5 and 6 may be disposed on a semiconductor substrate 3. The transistor TR may include the gate dielectric structure 36 and the gate electrode structure 57g as described in FIGS. 5 and 6. The gate electrode structure 57g may include the first gate electrode pattern 51g and the second gate electrode pattern 54g.

A resistor structure 57r may be disposed on the semiconductor substrate 3. The resistor structure 57r may include pad portions 57ra and a resistor body 57rb connecting between the pad portions 57ra. In some embodiments, the resistor body 57rb may have a width Drb' substantially equal to the width Dg of the gate electrode structure 57g.

The pad portions 57ra may each include a liner pattern 51r and a pad pattern 54r. The pad pattern 54r may have a pillar shape. The liner pattern 51r may cover a sidewall and a lower surface of the pad pattern 54r.

As described above in FIGS. 3A and 3B, the liner pattern 51r and the resistor body 57rb may commonly a first conductive layer 39r. The liner pattern 51r may include a second conductive layer 42ra, and the resistor body 57rb may include a second conductive layer 42rb. The second conductive layer 42ra of the liner pattern 51r may cover the sidewall and the lower surface of the pad pattern 54r. The second conductive layer 42rb of the resistor body 57rb may continuously and laterally extend from the second conductive layer 42ra of the liner pattern 51r and may have a pillar shape. The second conductive layer 42rb of the resistor body 57rb may be integrally coupled to the second conductive layer 42ra of the liner pattern 51r.

At least one of the first conductive layer 39r, the second conductive layer 42ra and 42rb and the pad pattern 54r may be formed of a material different from the gate electrode structure 57g. For example, the first gate electrode pattern 51g may be formed of the same material as one of the first conductive layer 39r and the second conductive layer 42ra and 42rb, and the second gate electrode pattern 54g may be formed of the same material as the pad pattern 54r, For example, the first gate electrode pattern 51g may be formed of the same material as the first conductive layer 39r, and the second conductive layer 42ra and 42rb may be formed of a material different from the first and second gate electrode patterns 51g and 54g. For example, the first gate electrode pattern 51g may be formed of a work function adjusting material, such as TiAl, TiAlC, TiN or TaN, capable of adjusting a work function of the gate electrode structure 57g. The second gate electrode pattern 54g may be formed of a low resistance metal having a low resistivity, for example, tungsten, to lower a resistance of the gate electrode structure 57g. The first conductive layer 39r may be formed of the same material as the first gate electrode pattern 51g. The pad pattern 54r may be formed of the same material as the second gate electrode pattern 54g. The second conductive layer 42ra and 42rb may be formed of a material, for example, polysilicon, having a resistivity higher than that of the first conductive layer 39r and the pad pattern 54r to increase a magnitude of resistance of the resistor structure 57r.

In some embodiments, the first conductive layer 39r may be formed of polysilicon having a relatively high resistivity. The second conductive layer 42ra and 42rb may be formed of the same material as the first gate electrode pattern 51g.

The pad pattern 54r may be formed of the same material as the second gate electrode pattern 54g.

The semiconductor device including one transistor TR is described with reference to FIGS. 10 and 11. However, the present inventive concept is not limited thereto. For example, the semiconductor device according to some embodiments may include a plurality of transistors TR.

Figure 12:
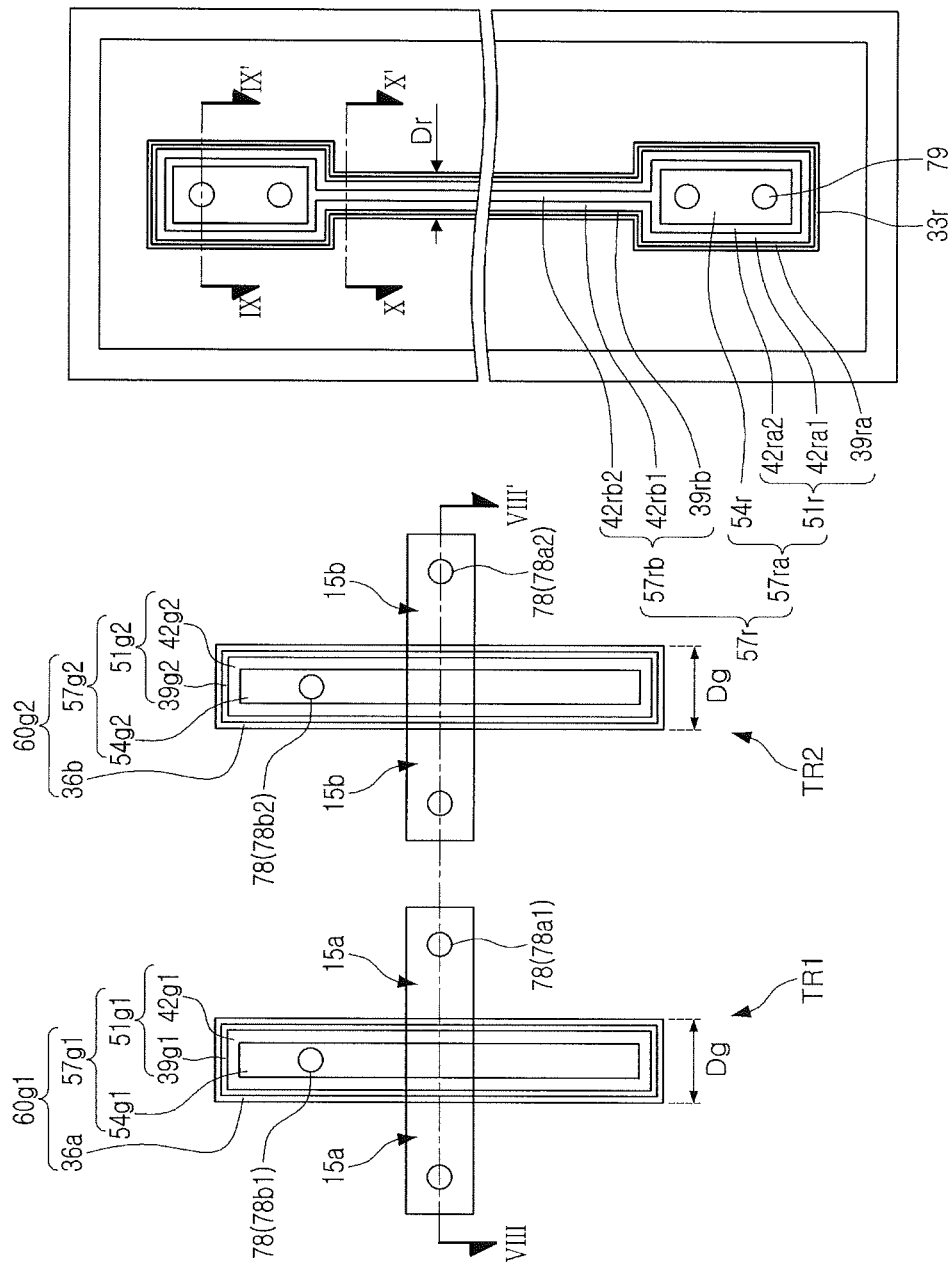
FIG. 12 is a plan view illustrating a semiconductor device according to some embodiments of the present inventive concept.
Figure 13A:
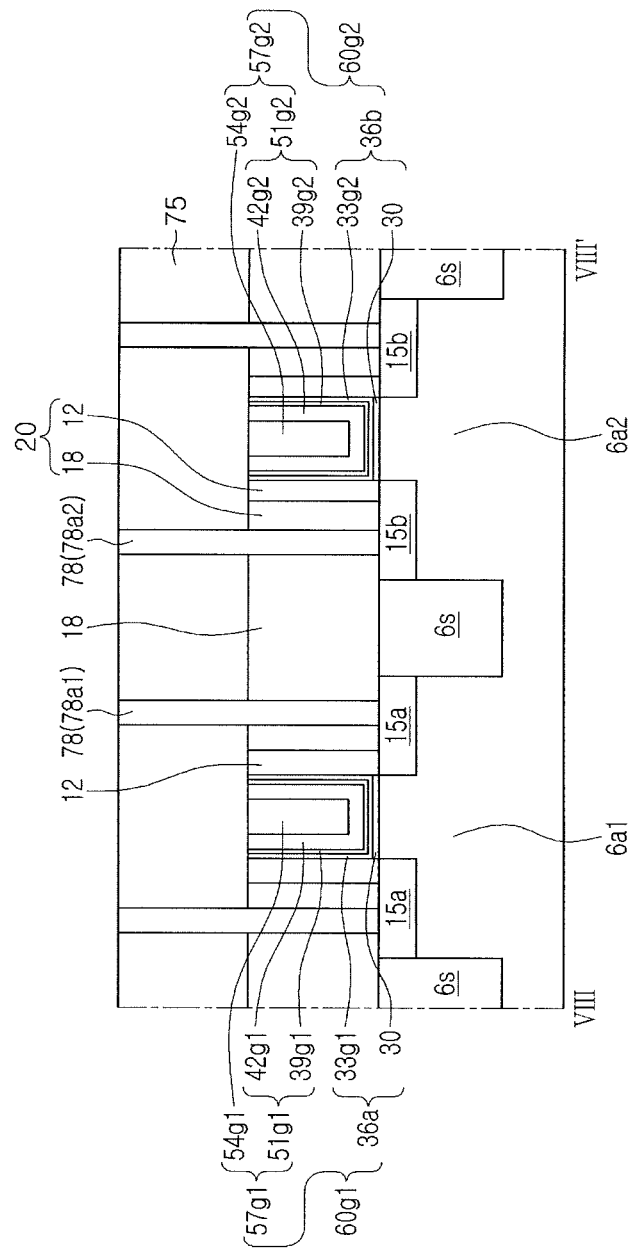
FIGS. 13A and 13B are cross-sections illustrating a semiconductor according to some embodiments of the present inventive concept.
Figure 13B:
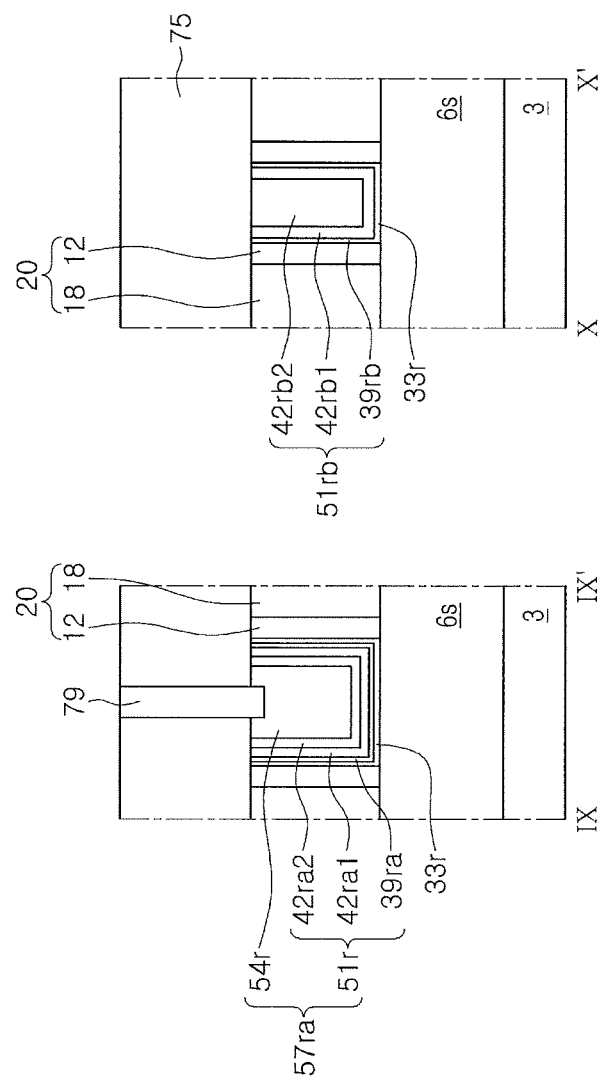

FIG. 12 is a plan view illustrating a semiconductor device according to some embodiments. FIG. 13A is a cross-section taken along line VIII-VIII' of FIG. 12. FIG. 13B is a cross-section taken along lines IX-IX' or X-X' of FIG. 12.

Referring to FIGS. 12, 13A and 13B, an isolation region 6s may be formed on a semiconductor substrate 3 to define a first active region 6a1, a second active region 6a2 and a guard ring 6g. A first transistor TR1, a second transistor TR2 and a resistor structure 57r may be formed on the semiconductor substrate 3.

The first transistor TR1 may include a first gate structure 60g1 crossing the first active region 6a1 and first source/drain regions 15a in the first active region 6a1 at opposite sides of the first gate structure 60g1. The second transistor TR2 may include a second gate structure 60g2 crossing the second active region 6a2 and second source/drain regions 15b in the second active region 6a2 at opposite sides of the second gate structure 60g2.

The first gate structure 60g1 may include a first gate electrode structure 57g1 and a first gate dielectric structure 36a covering a sidewall and a lower surface of the first gate electrode structure 57g1. The second gate structure 60g2 may include a second gate electrode structure 57g2 and a second gate dielectric structure 36b covering a sidewall and a lower surface of the second gate electrode structure 57g2.

In some embodiments, the first transistor TR1 may be an NMOS transistor, and the second transistor TR2 may be a PMOS transistor. In other embodiments, the first and second transistors TR1 and TR2 may be NMOS transistors having different threshold voltages or PMOS transistors having different threshold voltages. Thus, the first and second transistors TR1 and TR2 may be formed to have different properties.

The first gate dielectric structure 36a may include a first gate dielectric layer 33g1 covering the sidewall and the lower surface of the first gate electrode structure 57g1 and an interfacial dielectric layer 30 between the first gate dielectric layer 33g1 and the first active region 6a1. The second gate dielectric structure 36b may include a second gate dielectric layer 33g2 covering the sidewall and the lower surface of the second gate electrode structure 57g2 and the interfacial dielectric layer 30 between the second gate dielectric layer 33g2 and the second active region 6a2. The interfacial dielectric layer 30 may be formed of interfacial oxide. The first and second gate dielectric layers 33g1 and 33g2 may be formed of a high-k dielectric material.

The first gate electrode structure 57g1 may include a first gate electrode pattern 51g1 and a second gate electrode pattern 54g1. The second gate electrode structure 57g2 may include a third gate electrode pattern 51g2 and the fourth gate electrode pattern 54g2.

The second and fourth gate electrode patterns 54g1 and 54g2 may be formed to have a pillar shape. The first and third gate electrode patterns 51g1 and 51g2 may be formed to have a liner shape and may respectively cover sidewalls and lower surfaces of the second and fourth gate electrode patterns 54g1 and 54g2.

The first gate electrode pattern 51g1 may include a first gate conductive layer 39g1 and a second gate conductive layer 42g1 on the first gate conductive layer 39g1. The third gate electrode pattern 51g2 may include a third gate conductive layer 39g2 and a fourth gate conductive layer 42g2 on the third gate conductive layer 39g2.

A resistor dielectric layer 33r may be disposed to cover a sidewall and a lower surface of the resistor structure 57r. In some embodiments, the resistor dielectric layer 33r may be formed of a high-k dielectric layer similar to that of the first and second gate dielectric structures 36a and 36b.

The resistor structure 57r may include pad portions 57ra and a resistor body 57rb connecting the pad portions 57ra. The pad portions 57ra may each include a pad pattern 54r and a liner pattern 51r covering a sidewall and a lower surface of the pad pattern 54r. The resistor body 57rb may be formed to continuously and laterally extend from the liner pattern 51r. The resistor body 57rb may be integrally coupled to the liner pattern 51r.

The liner pattern 51r may be formed of a plurality of pad conductive layers 39ra, 42ra1 and 42ra2. The liner pattern 51r may include a first pad conductive layer 39ra, a second pad conductive layer 42ra1 on the first pad conductive layer 39ra and a third pad conductive layer 42ra2 on the second pad conductive layer 42ra1.

The resistor body 57rb may include a plurality of body conductive layers 39rb, 42rb1 and 49rb2 laterally extending from the plurality of pad conductive layers 39ra, 42ra1 and 42ra2. For example, the resistor body 57rb may include a third body conductive layer 42rb2 laterally extending from the third pad conductive layer 42ra2 of the liner pattern 51r and having a pillar shape, a second body conductive layer 42rb1 laterally extending from the second pad conductive layer 42ra1 of the liner pattern 51r and covering a sidewall and a lower surface of the third body conductive layer 42rb2 to have a liner shape, and a first body conductive layer 39rb laterally extending from the first pad conductive layer 39ra of the liner pattern 51r. Thus, the first pad conductive layer 39ra and the first body conductive layer 39rb may be formed of the same material, for example, a first material, and the second pad conductive layer 42ra1 and the second body conductive layer 42rb1 may be formed of the same material, for example, a second material. Likewise, the third pad conductive layer 42ra2 and the third body conductive layer 42rb2 may be formed of the same material, for example, a third material. For example, the first to third materials may be different from each other. The pad pattern 54r may be formed of a fourth material.

In some embodiments, the first and third gate conductive layers 39g1 and 39g2 may be formed of the same material. The second and fourth gate conductive layers 42g1 and 42g2 may be formed of different materials.

In some embodiments, the first and third gate conductive layers 39g1 and 39g2 may be formed of the same material as the first material of the first pad conductive layer 39ra and the first body conductive layer 39rb.

In some embodiments, one of the second and fourth gate conductive layers 42g1 and 42g2 may be formed of the same material as the second material of the second pad conductive layer 42ra1 and the second body conductive layer 42rb 1, and the other may be formed of the same material as the third material of the third pad conductive layer 42ra2 and the third body conductive layer 42rb2. For example, the second gate conductive layer 42g1 may be formed of the same material as the second material of the second pad conductive layer 42ra1 and the second body conductive layer 42rb1, and the fourth gate conductive layer 42g2 may be formed of the same material as the third material of the third pad conductive layer 42ra2 and the third body conductive layer 42rb2.

The second and fourth gate electrode patterns 54g1 and 54g2 may be formed of the same material as the fourth material of the pad pattern 54r.

In some embodiments, one of the first to third materials may be metal nitride such as TiN or TaN, another may be metal alloy such as TiN, TaN, TiAl or TiAlC, and the other may be polysilicon having a relatively high resistivity compared to the other materials. For example, the first material may be TiN, the second material may include at least one of TiN, TaN, TiAl and TiAlC, and the third material may be polysilicon. The fourth material may be tungsten having a lower resistivity than that of the first to third materials.

In some embodiments, one of the first to third materials may be metal nitride, and the others may be metal alloys containing different materials. For example, the first material may be TiN, one of the second and third materials may include TiAl or TiAlC, and the other may include TiN and may not include TiAl or TiAlC.

In some embodiments, the first material may be used to form a conductive layer capping a high-k dielectric. The second material may be used as a work function adjusting material capable of adjusting a threshold voltage of the first transistor TR1. The third material may be used as a work function adjusting material capable of adjusting a threshold voltage of the second transistor TR2. The second and third materials may be selected from the materials as described above to meet characteristics of the first and second transistors TR1 and TR2 and may be different from each other.

The lower insulating structure 20 including the spacers 12 and the lower insulating layer 18 as described in FIGS. 5 and 6 may be formed on the semiconductor substrate 3. The spacers 12 may be disposed on the sidewalls of the first and second gate electrode structures 57g1 and 57g2 and the sidewall of the resistor structure 57r.

An upper insulating structure 75 may be formed on the lower insulating structure 20. Transistor contact plugs 78 electrically connected to the first and second transistors TR1 and TR2 and resistor contact plugs 79 electrically connected to the pad portions 57ra of the resistor structure 57r may be formed on the semiconductor substrate 3. The transistor contact plugs 78 may include source/drain contact plugs 78a1 and 78a2 electrically connected to the first and second source/drain regions 15a and 15b, respectively, and gate contact plugs 78b1 and 78b2 electrically connected to the first and second gate electrode structures 57g1 and 57g2, respectively.

Embodiments of the present inventive concept are not limited to a planar shape of the resistor structure 57r as shown in FIGS. 1, 5, 10 and 12. For example, the resistor structure 57r may be modified to include end pad portions, intermediate pad portions between the end pad portions and resistor bodies connecting the end pad portions and intermediate pad portions.

Figure 14:
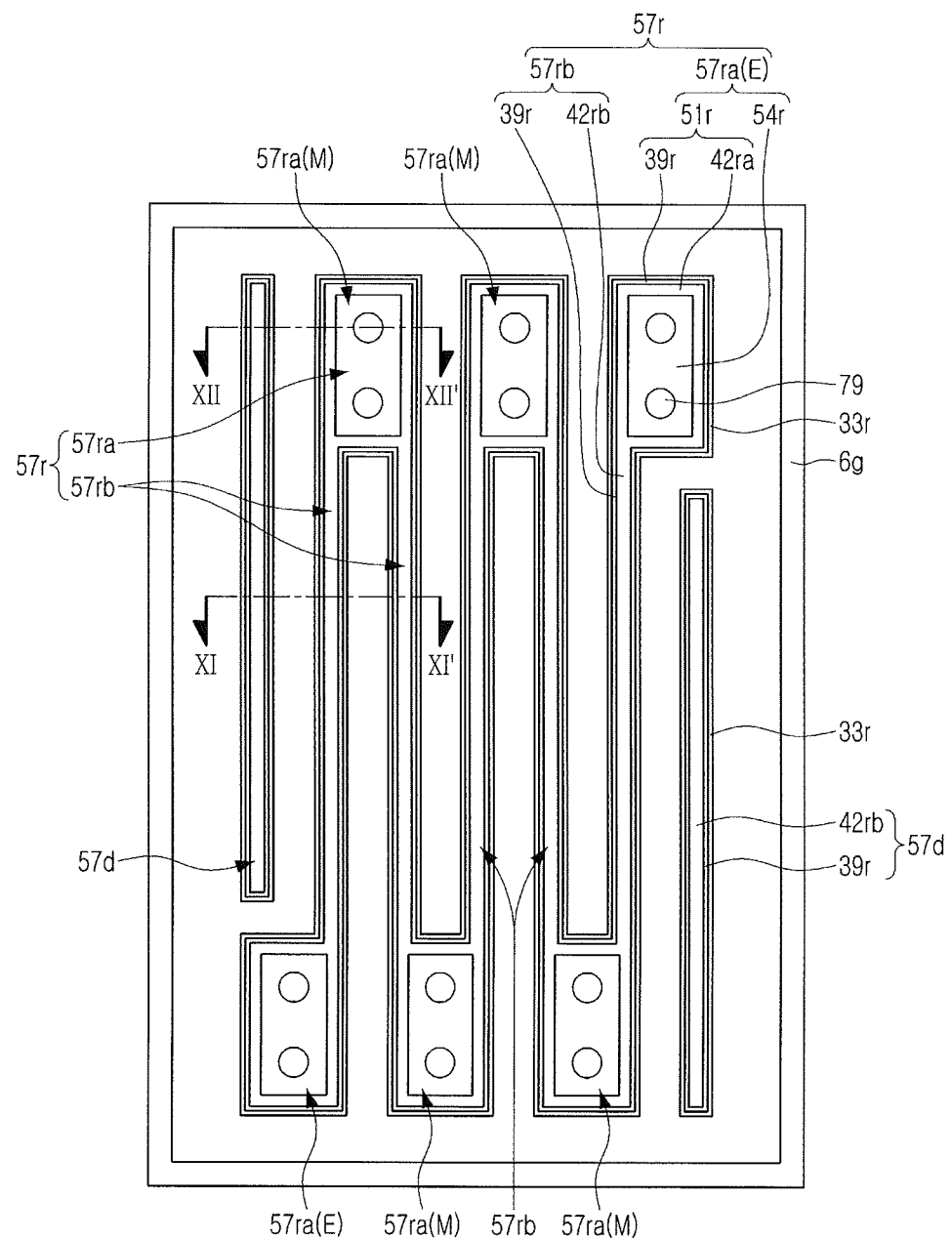
FIG. 14 is a plan view illustrating a semiconductor device according to some embodiments of the present inventive concept.
Figure 15:
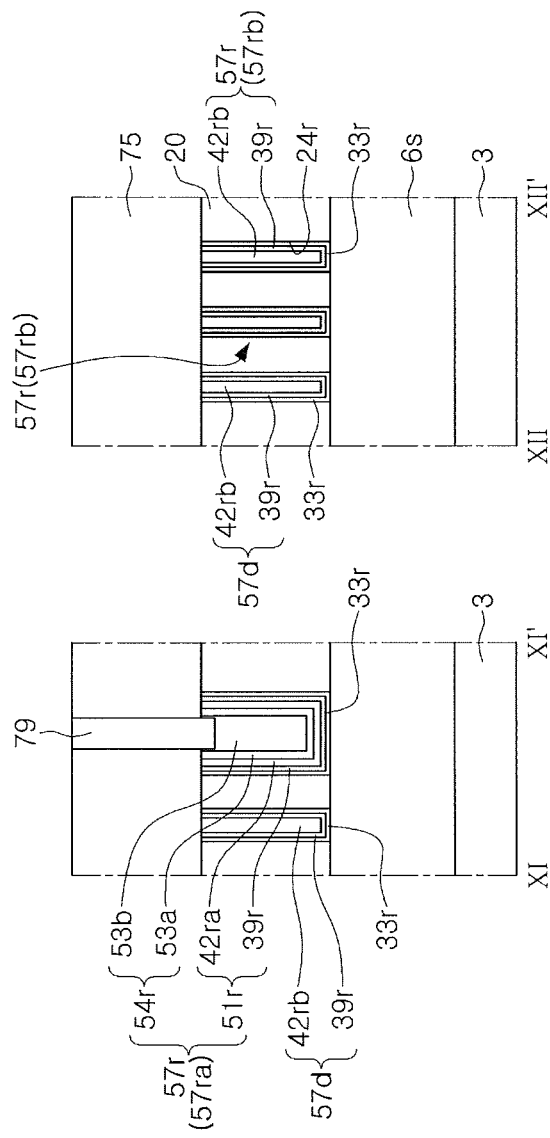
FIG. 15 is a cross-section illustrating a semiconductor device according to some embodiments of the present inventive concept.

FIG. 14 is a plan view illustrating a resistor structure of a semiconductor device according to some embodiments. FIG. 15 is a cross-sections taken along lines XI-XI' and XII-XII' of FIG. 14.

Referring to FIGS. 14 and 15, a resistor structure 57r may be surrounded by the guard ring 6g as described in FIG. 5. The resistor structure 57r may include a plurality of pad portions 57ra and resistor bodies 57rb connecting between the plurality of pad portions 57ra. The pad portions 57ra may include end pad portions E at both ends of the resistor structure 57r and intermediate pad portions M between the end pad portions E, which are spaced apart from each other.

Resistor contact plugs 79 may be disposed on the end pad portions E and the intermediate pad portions M of the pad portions 57ra. A resistance value in the resistor structure 57r may differs depending on a length of the resistor body 57rb between selected pad portions 57ra among the end pad portions E and the intermediate pad portions M of the pad portions 57ra. For example, in the resistor structure 57r, a resistance value between the end pad portions E may differ from a resistance value between one of the end pad portions E and one of the intermediate pad portions M. Thus, the intermediate pad portions M may be used as a means to achieve a desired resistance value.

In some embodiments, the resistor bodies 57rb may extend parallel to one another and may have a liner shape. The pad portions 57ra including the end pad portions E and the intermediate pad portions M may be disposed at both ends of the resistor bodies 57rb.

In some embodiments, a group of the resistor bodies 57rb may be disposed between the dummy patterns 57d. The dummy patterns 57d may be formed of the same material and structure as the resistor bodies 57rb.

The resistor structure 57r may have the same structure as any one of the resistor structures 57r described in FIGS. 1 to 13B. For example, the pad portions 57ra of resistor structure 57r may be formed of substantially the same structure or material as the pad portions 57ra described in FIGS. 3A and 3B, and the resistor body 57rb of the resistor structure 57r may be formed of substantially the same structure or material as the resistor body 57rb described in FIGS. 3A and 3B.

In FIGS. 1 to 15, one resistor structure 57r is described, but is not limited thereto. For example, the semiconductor device according to some embodiments may include a plurality of resistor structures 57r having different resistances.

Figure 16:
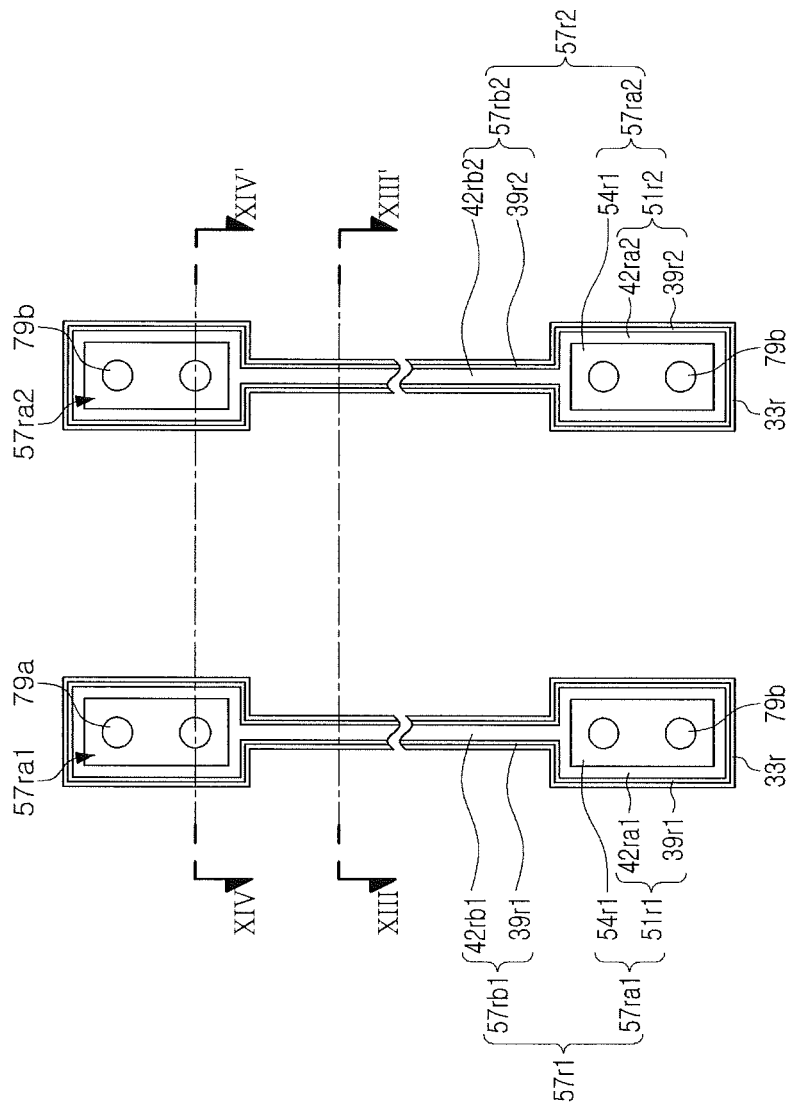
FIG. 16 is a plan view illustrating a semiconductor device according to some embodiments of the present inventive concept.
Figure 17:
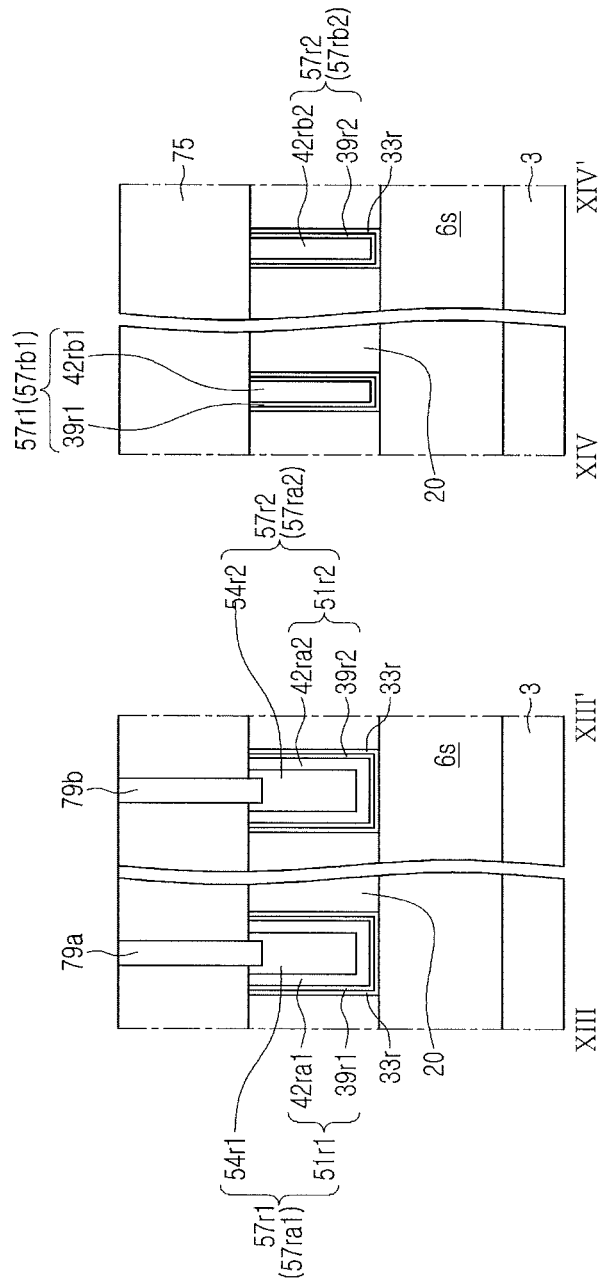
FIG. 17 is a cross-section illustrating a semiconductor device according to some embodiments of the present inventive concept.

FIG. 16 is a plan view illustrating a plurality of resistors of a semiconductor device according to some embodiments. FIG. 17 is a cross-section taken along lines XIII-XIII' and XIV-XIV' of FIG. 16.

Referring to FIGS. 16 and 17, a first resistor structure 57r1 and a second resistor structure 57r2 that have different resistances may be disposed on a semiconductor substrate 3. The first and second resistor structures 57r1 and 57r2 may be disposed on the isolation region 6s on the semiconductor substrate 3 as described in FIGS. 1, 2A and 2B. A resistor dielectric layer 33r may be disposed to cover a sidewall and a lower surface of each of the first and second resistor structures 57r1 and 57r2. The resistor dielectric layer 33r may be formed of a high-k dielectric material.

The first resistor structure 57r1 may include first pad portions 57ra1 and a first resistor body 57rb1 between the first pad portions 57ra1. The second resistor structure 57r2 may include second pad portions 57ra2 and a second resistor body 57rb2 between the second pad portions 57ra2.

The first pad portions 57ra1 may each include a first liner pattern 51r1 and a first pad pattern 54r1. The second pad portions 57ra2 may each include a second liner pattern 51r2 and a second pad pattern 54r2.

The first and second pad patterns 54r1 and 54r2 may have a pillar shape. The first and second liner patterns 51r1 and 51r2 may cover sidewalls and lower surfaces of the first and second pad patterns 54r1 and 54r2, respectively. The first liner pattern 51r1 may include a first conductive layer 39r1 and a second conductive layer 42ra1 on the first conductive layer 39r1. The second liner pattern 51r2 may include a third conductive layer 39r2 and a fourth conductive layer 42ra2 on the third conductive layer 39r2. The second conductive layer 42ra1 may cover and contact a sidewall and a lower surface of the first pad pattern 54r1. The first conductive layer 39r1 may be formed to surround the second conductive layer 42ra1. The fourth conductive layer 42ra2 may cover and contact a sidewall and a lower surface of the second pad pattern 54r2. The third conductive layer 39r2 may be formed to surround the fourth conductive layer 42ra2.

The first resistor body 57rb1 may be formed to continuously and laterally extend from the first and second conductive layers 39r1 and 42ra1 of the first liner pattern 51r1. The first resistor body 57rb1 may be integrally coupled to the first and second conductive layers 39r1 and 42ra1 of the first liner pattern 51r1. The first resistor body 57rb1 may include first and second conductive layers 39r1 and 42rb1 corresponding to the first and second conductive layers 39r1 and 42ra1, respectively, of the first liner pattern 51r1. The second conductive layer 42rb1 of the first resistor body 57rb1 may laterally extend from the second conductive layer 42ra1 having a linear shape, of the first liner pattern 51r1, to have a pillar shape. The first conductive layer 39r1 of the first resistor body 57rb1 may have a thickness equal to a thickness of the first conductive layer 39r1 of the first liner pattern 51r1 and may cover a sidewall and a lower surface of the second conductive layer 42rb1.

The second resistor body 57rb2 may be formed to continuously and laterally extend from the third and fourth conductive layers 39r2 and 42ra2 of the second liner pattern 51r2. The second resistor body 57rb2 may be integrally coupled to the third and fourth conductive layers 39r2 and 42ra2 of the second liner pattern 51r2. The second resistor body 57rb2 may include third and fourth conductive layers 39r2 and 42rb2 corresponding to the third and fourth conductive layers 39r2 and 42ra2 of the second liner pattern 51r2, respectively.

In some embodiments, one of the first and second conductive layers 39r1 and 42ra1 may be formed of the same material as one of the third and fourth conductive layers 39r2 and 42ra2, and the other of the first and second conductive layers 39r1 and 42ra1 may be formed of a different material from the other of the third and fourth conductive layers 39r2 and 42ra2.

In some embodiments, the first conductive layer 39r1 may be formed of the same material as the third conductive layer 39r2, and the second conductive layer 42ra1 may be formed of a different material from the first conductive layer 39r1, the third conductive layer 39r2 and the fourth conductive layer 42ra2. For example, the first conductive layer 39r1 and the third conductive layer 39r2 may be formed of TiN, TaN, TiAl, TiAlC or a combination thereof. The second conductive layer 42ra1 may be formed of a different from the first, third and fourth conductive layers 39r1, 39r2 and 42ra2 among polysilicon, TiN, TaN, TiAl, TiAlC or a combination thereof. The fourth conductive layer 42ra2 may be formed of a different material from the first to third conductive layers 39r1, 42ra1 and 39r2 among polysilicon, TiN, TaN, TiAl, TiAlC or a combination thereof.

In some embodiments, the first and third conductive layers 39r1 and 39r2 may be formed of different materials, and the second and fourth conductive layers 42ra1 and 42ra2 may be formed of the same material.

The material types according to the example embodiments may be varied depending on a work function value required for the gate electrode or a resistance value required for the semiconductor device. The present inventive concept is not limited to the specific material types presented in the example embodiments, and material types not shown in the example embodiments may be included in the scope of the present inventive concept.

The first and second resistor structures 57r1 and 57r2 may be buried in the lower insulating structure 20 as described in FIGS. 1, 2A and 2B. An upper insulating structure 75 may be formed on the lower insulating structure 20 to cover the first and second resistor structures 57r1 and 57r2. Resistor contact plugs 79a and 79b may be formed to penetrate the upper insulating structure 75 and may be electrically connected to be the first and second pad portions 57ra1 and 57ra2 of the first and second resistor structures 57r1 and 57r2, respectively.

As described in FIGS. 1 to 17, the semiconductor device according to some embodiments may include at least one resistor structure 57r and/or at least one transistor TR. The semiconductor device according to example embodiments of the present inventive concept may include a three-dimensional cell array with the resistor structure 57r and the transistor TR.

Figure 18:
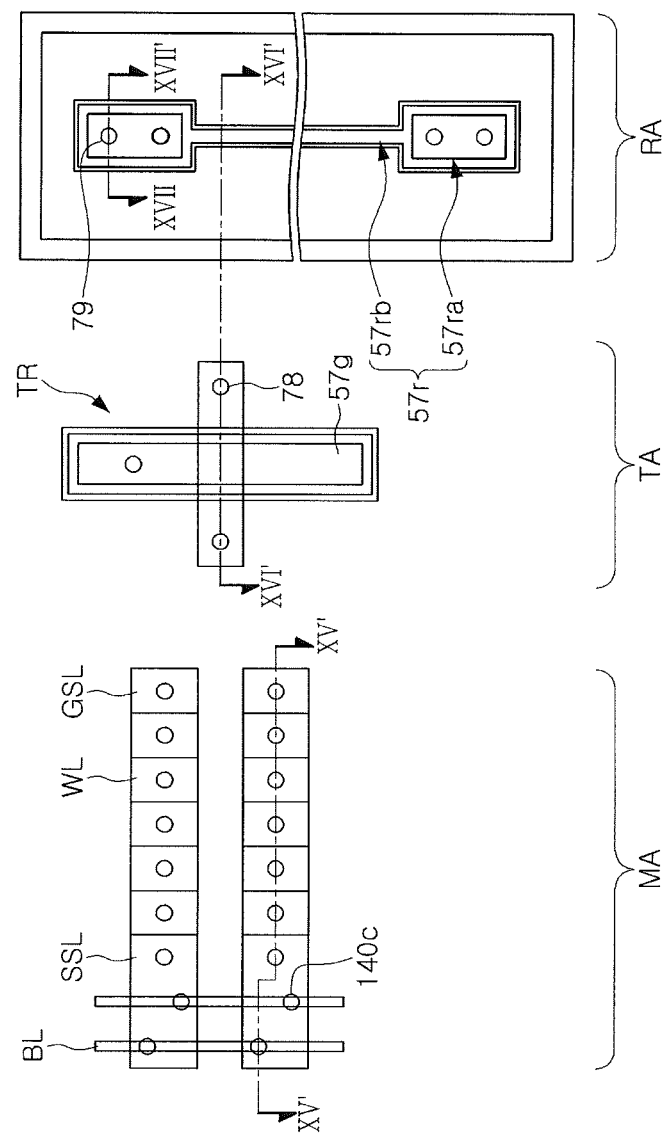
FIG. 18 is a plan view illustrating a semiconductor device according to some embodiments of the present inventive concept.
Figure 19A:
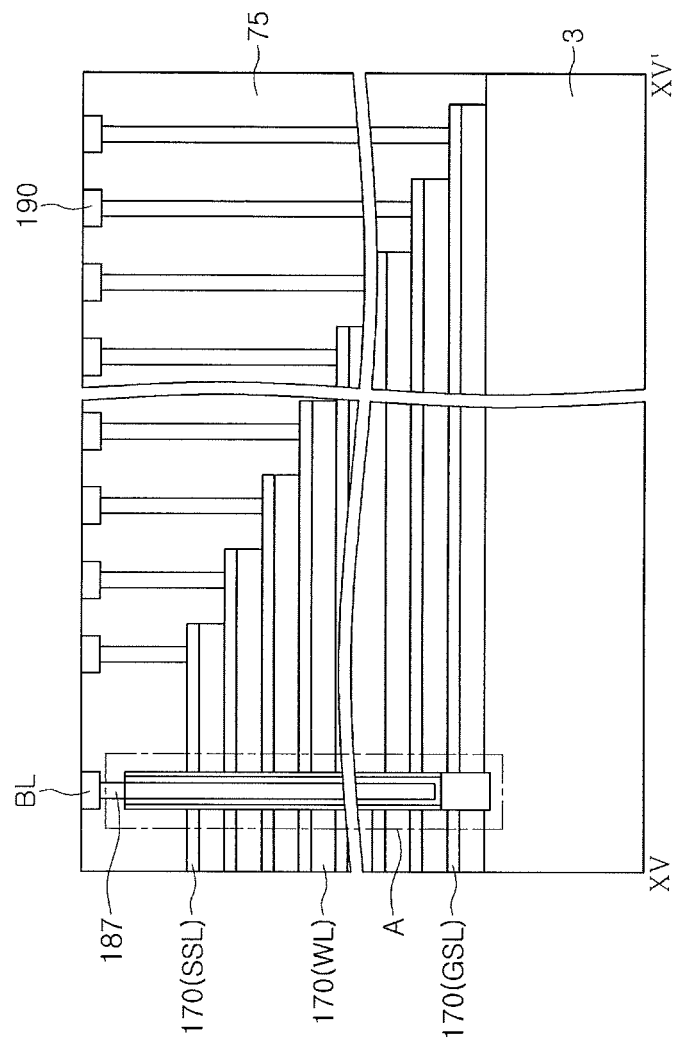
FIGS. 19A and 20 are cross-sections illustrating a semiconductor device according to some embodiments of the present inventive concept.
Figure 19B:
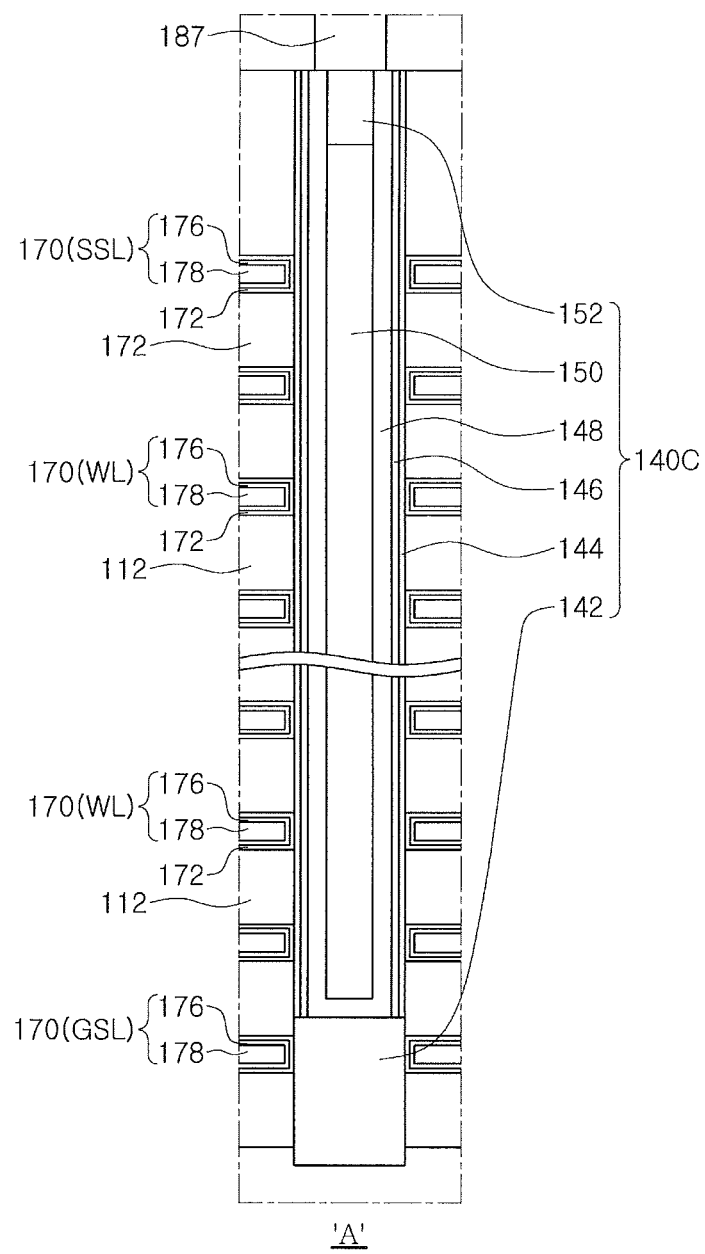
FIG. 19B is an enlarged view illustrating a portion of FIG. 19A.
Figure 20:
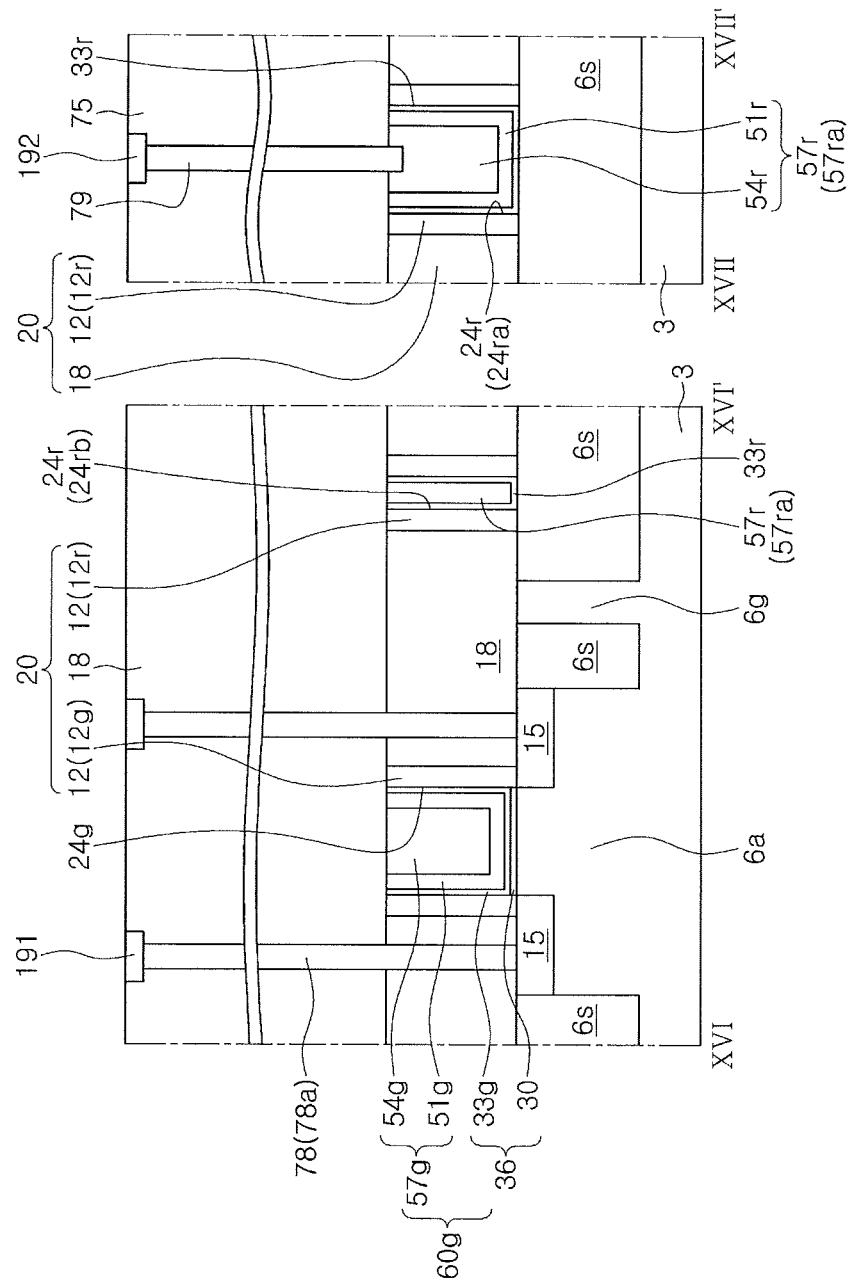

FIG. 18 is a plan view illustrating a semiconductor device including a three-dimensional cell array with a resistor structure and a transistor according to some embodiments. FIG. 19A is a cross-section taken along line XV-XV' of FIG. 18. FIG. 19B is an enlarged view illustrating portion A of FIG. 19A. FIG. 20 is a cross-section taken along lines XVI-XVI' and XVII-XVII' of FIG. 18.

Referring to FIGS. 18, 19A, 19B and 20, a semiconductor substrate 3 may include a memory cell array region MA, a transistor region TA and a resistor region RA. A three-dimensional cell array may be formed on the semiconductor substrate 3 in the memory cell array region MA. A transistor TR may be formed in the transistor region TA. A resistor structure 57r may be formed in the resistor region RA. The transistor TR may be one of the transistors described in FIGS. 5 to 13B, and the resistor structure 57r may be one of the resistor structures described in FIGS. 1 to 17. Thus, detailed descriptions of the transistor TR and the resistor structure 57r are omitted.

The three-dimensional memory cell array in the memory cell array region MA may include gate electrodes 170 arranged in a vertical direction relative to an upper surface of the semiconductor substrate 3 and a channel structure 140C extending in the vertical direction and penetrating the gate electrodes 170. An insulating layer 112 may be disposed between the gate electrodes 170 and between the gate electrodes 170 and the semiconductor substrate 3. The gate electrodes 170 may extend to different lengths in a parallel direction relative to the upper surface of the semiconductor substrate 3. Thus, end portions of the gate electrodes 170 may be arranged in a stepped shape. An upper insulating structure 75 may be disposed to cover the gate electrodes 170.

The gate electrodes 170 may each include a first electrode layer 176 and a second electrode layer 178. The first electrode layer 176 may cover a lower surface and an upper surface of the second electrode layer 178 and may extend between the channel structure 140C and the second electrode layer 178. The first electrode layer 176 may be formed of metal nitride such as TiN, and the second electrode layer 178 may be formed of metal such as tungsten.

An uppermost one of the gate electrodes 170 may function as a string selection line SSL of the three-dimensional memory cell array. A lowermost one of the gate electrodes 170 may function as a ground selection line GSL of the three-dimensional memory cell array. The gate electrodes 170 between the string selection line SSL and the ground selection line GSL may function as word lines WL of the three-dimensional memory cell array.

The channel structure 140C may include a semiconductor pattern 142, a core pattern 150, a cell pad pattern 152, a semiconductor layer 148, a first dielectric layer 146 and a data storage layer 144. The semiconductor pattern 142 may contact the semiconductor substrate 3. The semiconductor pattern 142 may have a sidewall facing the lowermost gate electrode 170 as the ground selection line GSL.

The semiconductor pattern 142 may be positioned at a lower level than the gate electrodes 170 as the word lines WL relative to the upper surface of the semiconductor substrate 3. The semiconductor pattern 142 may be an epitaxial material layer formed by a selective epitaxial growing process. For example, the semiconductor pattern 142 may be formed of monocrystalline silicon.

The core pattern 150 may be disposed on the semiconductor pattern 142 and may be formed of an insulating material, for example, silicon oxide. The cell pad pattern 152 may be disposed on the core pattern 150. The cell pad pattern 152 may have an n-type conductivity. The cell pad pattern 152 may be formed of, for example, polysilicon. The cell pad pattern 152 may be positioned at a higher level than the uppermost gate electrode 170 as the string selection line SSL relative to the upper surface of the semiconductor substrate 3.

The semiconductor layer 148 may cover a sidewall and a lower surface of the core pattern 150. The core pattern 150 and the semiconductor layer 148 may penetrate the string selection line SSL and the word lines WL. The semiconductor layer 148 may contact the semiconductor pattern 142. The semiconductor layer 148 may be referred to as a channel layer. The semiconductor layer 148 may be formed of, for example, polysilicon. The semiconductor layer 148 may extend onto a sidewall of the cell pad pattern 152.

The first dielectric layer 146 and the data storage layer 144 may formed to extend along an outer sidewall of the semiconductor layer 148. The data storage layer 144 may be interposed between the semiconductor layer 148 and the first dielectric layer 146. A second dielectric layer 172 may be disposed on the upper and lower surfaces of the gate electrodes 170 and may extend between the channel structure 140C and the gate electrodes 170.

The first dielectric layer 146 may function as a tunnel dielectric layer. The first dielectric layer 146 may include silicon oxide and/or silicon oxide doped with impurities. The data storage layer 144 may function as a layer for storing data in a nonvolatile memory device such as a flash memory device. For example, the data storage layer 144 may be formed of a material, for example, silicon nitride, capable of trapping electrons injected through the first dielectric layer 146 from the semiconductor layer 148 for retention of the electrons or erasing the trapped electrons therein, depending on operation conditions of the nonvolatile memory device such as the flash memory device. The second dielectric layer 172 may include a high-k dielectric material such as AlO or the like. The second dielectric layer 172 may function as an a blocking dielectric layer.

In the memory cell array region MA, cell gate contact plugs 188 may be formed on the end portions of the gate electrodes 170, and a bit line contact plug 187 may be formed on the channel structure 140C. A bit line BL may be formed on the bit line contact plug 187. Gate interconnection lines 190 may be formed on the cell gate contact plugs 188, respectively.

In the transistor region TA, a transistor interconnection line 191 may be formed on the transistor contact plugs 78 as described in FIG. 6. In the resistor region RA, a resistor interconnection line 192 may be formed on the resistor contact plugs 79 as described in FIG. 6.

Figure 21A:
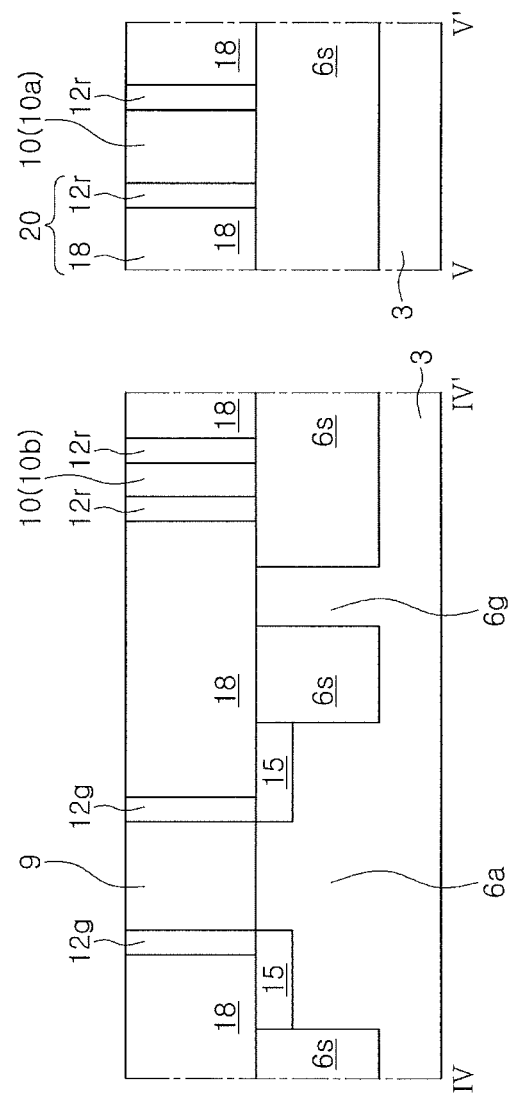
FIGS. 21A to 21C are cross-sections illustrating processing steps in the fabrication of semiconductor devices according to some embodiments of the present inventive concept.
Figure 21B:
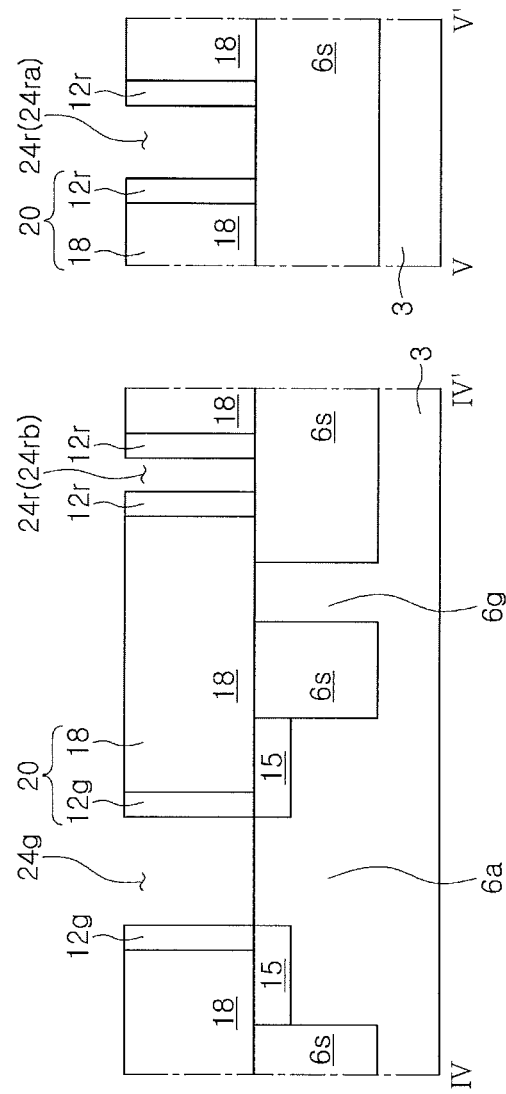
Figure 21C:
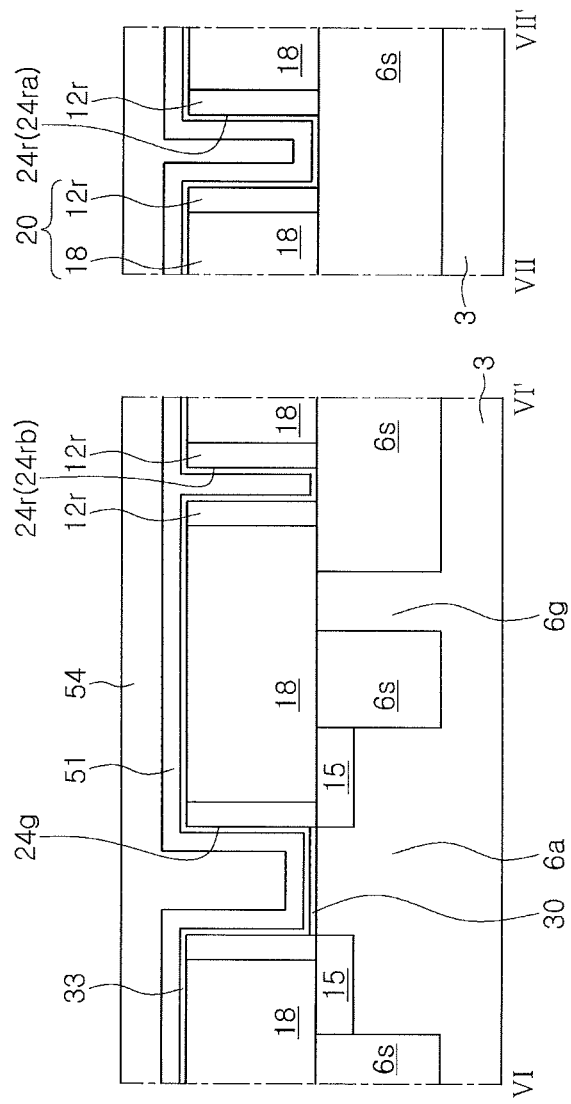

FIGS. 21A to 21C illustrates are cross-sections illustrating processing steps in the fabrication of semiconductor devices including a resistor structure according to some embodiments and are cross-sections taken along lines IV-IV' and V-V' of FIG. 5.

Referring to FIGS. 5 and 21A, an isolation region 6s may be formed on a semiconductor substrate 3 to define an active region 6a and a guard ring 6g. The isolation region 6s may be formed of an insulating material, such as silicon oxide.

A sacrificial gate 9 and a sacrificial resistor pattern 10 may be formed on the semiconductor substrate 3. The sacrificial gate 9 may be formed to intersect the active region 6a. The sacrificial resistor pattern 10 may include a pad portion 10a and a body portion 10b having a width smaller than a width of the pad portion 10a.

A gate spacer 12g may be formed on a sidewall of the sacrificial gate 9, and a resistor spacer 12r may be formed on a sidewall of the sacrificial resistor pattern 10. The gate spacer 12g and the resistor spacer 12r may be formed of, for example, silicon nitride.

Source/drain regions 15 may be formed in the active region 6a at opposite sides of the sacrificial gate 9 by performing an ion implantation process.

A lower insulating layer 18 may be formed by depositing an insulating layer on the semiconductor substrate 3 having the source/drain regions 15 therein and planarizing the insulating layer to expose upper surfaces of the sacrificial gate 9 and the sacrificial resistor pattern 10. The lower insulating layer 18 may be formed of, for example, silicon oxide.

Referring to FIGS. 5 and 21B, the sacrificial gate 9 and the sacrificial resistor pattern 10 may be removed to form a gate opening 24g and a resistor opening 24r. The resistor opening 24r may include a pad opening 24ra and a body opening 24rb having a width smaller than a width of the pad opening 24ra.

Referring to FIGS. 5 and 21C, an interfacial dielectric layer 30 may be formed on an surface of the active region 6a exposed by the gate opening 24g. A dielectric layer 33 and a first conductive layer 51 may be sequentially and conformally formed on the semiconductor substrate 3 having the interfacial dielectric layer 30 thereon.

The first conductive layer 51 may be formed of a single layer. However, the present inventive concept is not limited thereto. For example, the first conductive layer 51 may be formed of multiple layers to form the liner pattern 51r (refer to FIGS. 3A and 3B) including multiple layers.

The second conductive layer 54 may be formed of a single layer. However, the present inventive concept is not limited thereto. For example, the second conductive layer 54 may be formed of multiple layers to form the pad pattern 54r (refer to FIG. 4) including multiple layers.

The first conductive layer 51 may be formed with a thickness sufficient to fill the body opening 24rb while not filling the gate opening 24g and the pad opening 24ra of the resistor opening 24r.

A second conductive layer 54 may be formed on the first conductive layer 51. The second conductive layer 54 may fill a remaining portion of each of the gate opening 24g and the pad opening 24ra. Since the body opening 24rb is filed by the first conductive layer 51, the second conductive layer 54 may not fill the body opening 24rb.

Referring again to FIGS. 5 and 6, the second conductive layer 54, the first conductive layer 51 and the dielectric layer 33 may be planarized by, for example, a chemical mechanical polishing process, until exposing an upper surface of the lower insulating layer 18, such that the gate structure 60g and the resistor structure 57r as descried in FIGS. 5 and 6 may be formed. Since the resistor structure 57r is concurrently formed while forming the gate structure 60g, productivity of the semiconductor device may be enhanced.

The upper insulating structure 75 may be formed, and the transistor and resistor contact plugs 78 and 79 may be formed to penetrate the upper insulating structure 75 and/or the lower insulating layer 18.

In some embodiments, referring again to FIG. 7, before forming the upper insulating structure 75, the gate structure 60g and the resistor structure 57r may each be partially etched, and then the gate capping pattern 63g and the resistor capping pattern 63r may be formed in spaces formed by etching the gate structure 60g and the resistor structure 57r. Accordingly, the semiconductor device as described in FIG. 7 may be formed.

In some embodiments, referring to FIG. 8, before forming the upper insulating structure 75, the gate capping pattern 63g' and the resistor capping pattern 63r' may be formed to cover the gate structure 60g and the resistor structure 57r, respectively. Accordingly, the semiconductor device as described in FIG. 8 may be formed.

In some embodiments, after forming the gate structure 60g and the resistor structure 57r, the three-dimensional memory cell array as described in FIGS. 18, 19A and 19B may be formed on the semiconductor substrate 3.

As described above, the semiconductor device according to some embodiments of the present inventive concept may include the resistor structure 57r, including the pad portions 57ra and the resistor body 57rb connecting the pad portions 57ra. The pad portions 57ra may include a pad pattern 54r formed of a relatively low resistivity material, and the resistor body 57rb may not include the material forming the pad pattern 54r and may be formed of a material having a higher resistivity than the pad pattern 54r. Thus, since the resistor body 57rb increases a resistance of the resistor structure 57r, a magnitude of resistance of the resistor structure 57r may increase even without increasing a length of the resistor structure 57r.

The resistor structure 57r may be formed along with the gate electrode structure 57g including the first gate electrode pattern 51g and the second gate electrode pattern 54g. The first gate electrode pattern 51g may be the work function adjusting layer of the gate electrode structure 57g, and the second gate electrode pattern 54g may be the low resistance conductive layer having a low resistivity compared to the first gate electrode pattern 51g. The pad pattern 54r of the resistor structure 57r may be formed of the low resistance conductive layer (i.e., the second gate electrode pattern 54g) of the gate electrode structure 57g, and the resistor body 57rb may be formed of the relatively high resistivity work function adjusting layer (i.e., the first gate electrode pattern 51g) of the gate electrode structure 57g. Thus, since the resistance of the resistor structure 57r increases without increasing the length of the resistor body 57rb while forming the resistor structure 57r and the gate electrode structure 57g together, productivity and integration density of the semiconductor device may be enhanced.

While the present inventive concept have been particularly shown and described with reference to example embodiments thereof, it will be understood by those of ordinary skill in the art that various changes in form and details may be made therein without departing from the spirit and scope of the present disclosure as defined by the following claims.

What is claimed is:

1. A semiconductor device comprising:
   a semiconductor substrate; and
   a resistor structure on the semiconductor substrate,
   wherein the resistor structure includes pad portions and a resistor body connecting the pad portions;
   wherein each of the pad portions has a width greater than a width of the resistor body,
   wherein each of the pad portions includes a pad pattern and a liner pattern covering a sidewall and a lower surface of the pad pattern;
   wherein the resistor body extends laterally from the liner pattern; and
   wherein the pad pattern includes a different material from the resistor body and the liner pattern.

2. The semiconductor device of claim 1, further comprising a resistor dielectric layer covering a sidewall and a lower surface of the resistor structure.

3. The semiconductor device of claim 2, further comprising a lower insulating structure on the semiconductor substrate, the lower insulating structure including an opening,
   wherein the resistor structure and the resistor dielectric layer fill the opening of the lower insulating structure.

4. The semiconductor device of claim 3, wherein the resistor dielectric layer has a dielectric constant higher than the lower insulating structure.

5. The semiconductor device of claim 1, wherein the resistor body includes a material having a higher resistivity than the pad pattern.

6. The semiconductor device of claim 1, further comprising:
   an isolation region on the semiconductor substrate, the isolation region defining an active region and a guard ring; and
   a transistor on the semiconductor substrate, the transistor including a gate structure intersecting the active region,
   wherein the gate structure includes a gate electrode structure and a gate dielectric structure covering a sidewall and a lower surface of the gate electrode structure;
   wherein the gate electrode structure includes a first gate electrode pattern and a second gate electrode pattern,
   wherein the second gate electrode pattern has a pillar shape and includes a same material as the pad pattern; and
   wherein the first gate electrode pattern covers a sidewall and a lower surface of the second gate electrode pattern and includes a same material as the liner pattern and the resistor body.

7. The semiconductor device of claim 6, wherein the resistor structure is disposed on the isolation region surrounded by the guard ring.

8. The semiconductor device of claim 1:
   wherein the liner pattern and the resistor body each include a first conductive layer and a second conductive layer;
   wherein the pad pattern has a pillar shape;
   wherein the second conductive layer of the liner pattern is closer to the pad pattern than the first conductive layer of the liner pattern and covers the sidewall and the lower surface of the pad pattern; and
   wherein the second conductive layer of the resistor body laterally extends from the second conductive layer of the liner pattern.

9. The semiconductor device of claim 1:
   wherein the pad pattern includes a first pad layer and a second pad layer;
   wherein the second pad layer has a pillar shape; and wherein the first pad layer covers a sidewall and a lower surface of the second pad layer.

10. The semiconductor device of claim 1:
wherein in the resistor structure, the pad portions includes end pad portions and intermediate pad portions between the end pad portions; and
wherein the resistor body connects between the end pad portions and the intermediate pad portions.

11. A semiconductor device comprising:
a semiconductor substrate;
a first resistor structure on the semiconductor substrate; and
a first transistor on the semiconductor substrate,
wherein the first transistor includes a first gate structure;
wherein the first gate structure includes a first gate electrode structure and a first gate dielectric layer covering a sidewall and a lower surface of the first gate electrode structure;
wherein the first gate electrode structure includes a first gate electrode pattern and a second gate electrode pattern;
wherein the first gate electrode pattern covers a sidewall and a lower surface of the second gate electrode pattern and includes a conductive material having a higher resistivity than the second gate electrode pattern; and
wherein the first resistor structure includes first pad portions and a first resistor body connecting the first pad portions and includes a same material as the first gate electrode pattern.

12. The semiconductor device of claim 11:
wherein each of the first pad portions include a pad pattern having a pillar shape and a liner pattern covering a sidewall and a lower surface of the pad pattern;
wherein the first resistor body laterally extends from the liner pattern; and
wherein the first resistor body, the liner pattern and the first gate electrode pattern include a material having a higher resistivity than the pad pattern.

13. The semiconductor device of claim 11, further comprising a resistor dielectric layer covering a sidewall and a lower surface of the first resistor structure, the resistor dielectric layer including a same material as the first gate dielectric layer.

14. The semiconductor device of claim 11, further comprising a second transistor on the semiconductor substrate,
wherein the second transistor includes a second gate electrode structure and a second gate dielectric layer covering a sidewall and a lower surface of the second gate electrode structure;
wherein the second gate electrode structure includes a third gate electrode pattern and a fourth gate electrode pattern;
wherein the fourth gate electrode pattern has a pillar shape;

wherein the third gate electrode pattern is interposed between the fourth gate electrode pattern and the second gate dielectric layer; and
wherein the first resistor body includes a same material as the first gate electrode pattern and the third gate electrode pattern.

15. The semiconductor device of claim 11, further comprising a second resistor structure on the semiconductor substrate,
wherein the second resistor structure includes second pad portions and a second resistor body between the second pad portions; and
wherein the second resistor body has a resistance different from a resistance of the first resistor body.

16. A semiconductor device comprising:
a semiconductor substrate;
a resistor structure on the semiconductor substrate; and
a gate electrode on the semiconductor substrate,
wherein the resistor structure includes pad portions and a resistor body connecting the pad portions;
wherein the gate electrode includes a first pattern and a second pattern;
wherein the pad portions and the first pattern include a first conductive material; and
wherein the resistor body and the second pattern include a second conductive material having a higher resistivity than the first conductive material.

17. The semiconductor device of claim 16, wherein the first conductive material includes tungsten (W); and
wherein the second conductive material includes titanium nitride (TiN), tantalum-nitride (TaN), titanium-aluminum (TiAl) or titanium-aluminum-carbon (TiAlC).

18. The semiconductor device of claim 17:
wherein each of the pad portions has a width greater than a width of the resistor body;
wherein each of the pad portions includes a pad pattern and a liner pattern covering a sidewall and a lower surface of the pad pattern;
wherein the resistor body extends laterally from the liner pattern; and
wherein the pad pattern includes the first conductive material, and the liner pattern includes the second conductive material.

19. The semiconductor device of claim 18, further comprising a resistor dielectric layer covering a sidewall and a lower surface of the resistor structure.

20. The semiconductor device of claim 19, further comprising a lower insulating structure on the semiconductor substrate, the lower insulating structure including an opening,
wherein the resistor structure and the resistor dielectric layer fill the opening of the lower insulating structure.

* * * * *